(12) United States Patent
Crocker et al.

(10) Patent No.: US 7,691,541 B2
(45) Date of Patent: Apr. 6, 2010

(54) METHODS FOR ADDITIVE REPAIR OF PHASE SHIFT MASKS BY SELECTIVELY DEPOSITING NANOMETER-SCALE ENGINEERED STRUCTURES ON DEFECTIVE PHASE SHIFTERS

(75) Inventors: Percy Van Crocker, Chicago, IL (US); Sylvain Cruchon-Dupeyrat, Chicago, IL (US); Linette Demers, Chicago, IL (US); Robert Elghanian, Chicago, IL (US); Sandeep Disawal, Chicago, IL (US); Nabil Amro, Chicago, IL (US); Hua Zhang, Chicago, IL (US)

(73) Assignee: NanoInk, Inc., Skokie, IL (US)

( * ) Notice: Subject to any disclaimer, the term of this patent is extended or adjusted under 35 U.S.C. 154(b) by 305 days.

(21) Appl. No.: 10/689,547

(22) Filed: Oct. 21, 2003

(65) Prior Publication Data
US 2004/0175631 A1    Sep. 9, 2004

Related U.S. Application Data

(60) Provisional application No. 60/419,781, filed on Oct. 21, 2002.

(51) Int. Cl.
*G03F 1/00*  (2006.01)
*G03F 1/14*  (2006.01)
*B05D 3/00*  (2006.01)
*B32B 43/00* (2006.01)
*B82B 3/00*  (2006.01)

(52) U.S. Cl. ............ 430/5; 427/140; 977/857; 977/863

(58) Field of Classification Search .............. 430/5
See application file for complete search history.

(56) References Cited

U.S. PATENT DOCUMENTS

| 4,160,049 A | 7/1979 | Narcus |
| 4,200,668 A | 4/1980 | Segal et al. |
| 4,727,234 A | 2/1988 | Oprysko et al. |

(Continued)

FOREIGN PATENT DOCUMENTS

WO    WO 98/34092 A2    8/1998

(Continued)

OTHER PUBLICATIONS

K. Lieberman et al., "Near-field optical photomask repair with a femtosecond laser", *Journal of Miscroscopy*, vol. 194, Pt 2/3, May/Jun. 1999, pp. 537-541.

(Continued)

*Primary Examiner*—Mark F Huff
*Assistant Examiner*—John Ruggles
(74) *Attorney, Agent, or Firm*—Foley & Lardner LLP

(57) ABSTRACT

Photomask repair and fabrication with use of direct-write nanolithography, including use of scanning probe microscopic tips (e.g., atomic force microscope tips, etc.) for deposition of ink materials including sol-gel inks. Additive methods can be combined with subtractive methods. Holes can be filled with nanostructures. Heights of the nanostructures filling the holes can be controlled without losing control of the lateral dimensions of the nanostructures. Phase shifters on phase shifting masks (PSMs) are additively repaired with selectively deposited sol-gel material that is converted to solid oxide, which has optical transparency and index of refraction adapted for the phase shifters repaired.

33 Claims, 29 Drawing Sheets

U.S. PATENT DOCUMENTS

| | | | |
|---|---|---|---|
| 4,968,390 A * | 11/1990 | Bard et al. | 205/115 |
| 5,104,684 A | 4/1992 | Tao | |
| 5,126,574 A | 6/1992 | Gallagher | |
| 5,294,465 A | 3/1994 | Gallagher | |
| 5,441,386 A | 8/1995 | Hsieh | |
| 5,674,409 A | 10/1997 | Muller | |
| 5,747,120 A | 5/1998 | McLean, II et al. | |
| 5,751,683 A | 5/1998 | Kley | |
| 5,756,997 A | 5/1998 | Kley | |
| 5,772,905 A | 6/1998 | Chou | |
| 5,798,193 A | 8/1998 | Pierrat et al. | |
| 5,854,487 A | 12/1998 | Braunstein et al. | |
| 5,865,978 A * | 2/1999 | Cohen | 205/118 |
| 5,871,869 A * | 2/1999 | Park et al. | 430/5 |
| 5,879,860 A | 3/1999 | Rosolen et al. | |
| 5,948,470 A | 9/1999 | Harrison et al. | |
| 5,972,542 A * | 10/1999 | Starodubov | 430/5 |
| 5,980,998 A | 11/1999 | Sharma et al. | |
| 6,000,947 A | 12/1999 | Minne et al. | |
| 6,005,247 A | 12/1999 | Baum | |
| 6,037,087 A | 3/2000 | Pierrat et al. | |
| 6,057,546 A | 5/2000 | Braunstein et al. | |
| 6,090,507 A | 7/2000 | Grenon et al. | |
| 6,096,459 A | 8/2000 | Yang | |
| 6,100,524 A | 8/2000 | Yagi et al. | |
| 6,106,980 A | 8/2000 | Pierrat et al. | |
| 6,114,073 A | 9/2000 | Yang | |
| 6,139,993 A | 10/2000 | Lee et al. | |
| 6,144,028 A | 11/2000 | Kley | |
| 6,146,227 A * | 11/2000 | Mancevski | 977/876 |
| 6,165,649 A | 12/2000 | Grenon et al. | |
| 6,197,455 B1 | 3/2001 | Yedur et al. | |
| 6,253,015 B1 * | 6/2001 | Ukrainczyk | 385/129 |
| 6,268,273 B1 | 7/2001 | Kim et al. | |
| 6,270,946 B1 | 8/2001 | Miller | |
| 6,291,139 B1 | 9/2001 | Babine et al. | |
| 6,292,382 B1 | 9/2001 | Lewis | |
| 6,309,580 B1 | 10/2001 | Chou | |
| 6,310,342 B1 | 10/2001 | Braunstein et al. | |
| 6,322,938 B1 | 11/2001 | Cohn | |
| 6,337,479 B1 * | 1/2002 | Kley | 430/5 |
| 6,353,219 B1 | 3/2002 | Kley | |
| 6,373,976 B1 | 4/2002 | Pierrat et al. | |
| 6,396,966 B1 | 5/2002 | Lewis et al. | |
| 6,410,935 B1 | 6/2002 | Rajh et al. | |
| 6,426,499 B1 | 7/2002 | Koops | |
| 6,451,375 B1 | 9/2002 | Cotte et al. | |
| 6,452,171 B1 | 9/2002 | Moloni | |
| 6,455,175 B1 | 9/2002 | Kozlov et al. | |
| 6,600,856 B1 | 7/2003 | Lewis | |
| 6,635,311 B1 | 10/2003 | Mirkin et al. | |
| 6,827,979 B2 | 12/2004 | Mirkin et al. | |
| 2002/0009843 A1 | 1/2002 | Kyusho et al. | |
| 2002/0063212 A1 | 5/2002 | Mirkin et al. | |
| 2002/0086223 A1 * | 7/2002 | Hattori et al. | 430/5 |
| 2002/0122873 A1 | 9/2002 | Mirkin et al. | |
| 2002/0122992 A1 | 9/2002 | Kanamitsu et al. | |
| 2003/0087200 A1 | 5/2003 | Border et al. | |
| 2003/0127441 A1 | 7/2003 | Haight et al. | |
| 2003/0162004 A1 * | 8/2003 | Mirkin et al. | 428/210 |
| 2004/0026007 A1 | 2/2004 | Hubert et al. | |
| 2004/0101469 A1 | 5/2004 | Demers | |
| 2004/0127025 A1 | 7/2004 | Crocker | |
| 2004/0142106 A1 * | 7/2004 | Mirkin et al. | 427/256 |
| 2005/0235869 A1 | 10/2005 | Cruchon-Dupeyrat et al. | |
| 2005/0255637 A1 | 11/2005 | Zhang et al. | |

FOREIGN PATENT DOCUMENTS

| | | |
|---|---|---|
| WO | WO 00/41213 A | 7/2000 |
| WO | WO 01/91855 A1 | 12/2001 |
| WO | WO 02/45215 A | 6/2002 |
| WO | WO 03/019238 A2 | 3/2003 |
| WO | WO 03/021297 A2 | 3/2003 |

OTHER PUBLICATIONS

Xuefeng Wang et al., "Scanning Probe Contact Printing", *American Chemical Society*, May 17, 2003, p. est: 4.6.

Aaron Lewis et al., "Fountain pen nanochemlstry: Atomic force control of chrome etching", *Applied Physics Letters*, vol. 75, No. 17, Oct. 25, 1999, pp. 2689-2691.

http://www.micromagazine.com/archive/99/10/prodact1.htm., "Machine Vision Software Improves Accuracy of Photomask Repair System", Oct. 99.

Younan Xia et al., "Unconventional Methods for Fabricating and Patterning Nanostructures", *American Chemical Society*, 1999, pp. 1823-1848.

Nakamura, "Divot defect repair on a deep ultraviolet SiNx halftone mask", American Vacuum Society (1996), pp. 3892-3895.

Todd, B., et al., "Atomic force metrology and 3D modeling of micro-trenching in etched photomask features", Proceedings of the SPIE—The International Society for Optical Engineering, Proc. SPIE-INT. Soc. Opt. Eng, vol. 4409, pp. 618-631 (Jul. 2002).

International Search Report dated Aug. 12, 2004.

Ali, M. B., et al., "Atomic Force Microscope Tip Nanoprinting of Gold Nanoclusters", Langmuir, vol. 18, pp. 872-876 (2002).

Bieri, N. R., et al., "Microstructuring by printing and laser curing of nanoparticle solutions", Appl. Phys. Letts., vol. 82, No. 20, pp. 3529-3531 (2003).

Chen, K. M., et al., "Selective Self-Organization of Colloids on Patterned Polyelectrolyte Templates", Langmuir, vol. 16, pp. 7825-7834 (2000).

Chiba, A., et al., "Investigation of Pulsed Laser Removal of Cr and MoSi Film on a Quartz Substrate", Jpn. J. Appl. Phys., vol. 38, part 1, No. 12A, pp. 6577-6582 (1999).

Chou, S. Y., et al., "Imprint of sub-25 nm vias and trenches in polymers", Appl. Phys. Letters, vol. 87, No. 21, pp. 3114-3116 (1995).

Cordelair, J., et al., "Electrical Characterization of Polymethylsiloxane/MoSi2-Derived Composite Ceramics", J. Am. Ceram. Soc., vol. 84, No. 101, pp. 2256-2259 (2001).

Fujiki, K., et al., "Preparation of a silica gel-carbon black composite by the sol-gel process in the presence of polymer-grated carbon black", J. Mater. Sci., vol. 33, No. 7, pp. 1871-1879 (1998).

Hector, S., et al., "Review of progress in in extreme ultraviolet lithography masks", J. Vac. Sci. Technol. B, vol. 19, No. 6, pp. 2612-2616 (2001).

Hidber, P. C., et al., "Microcontact Printing of Palladium Colloids: Micron-Scale Patterning by Electroless Deposition of Copper", Langmuir, vol. 12, pp. 1375-1380 (1996).

Kim, J., et al., "Alternating phase shift mask defect printability for 130 nm and 100 nm KrF lithography", Intl. SEMATECH, (May 2000).

Maltabes, J. G., et al., Issues for Advanced Reticle Fabrication: (You want that reticle when?), Future Fab., Intl., vol. 11, pp. (Jun. 2001).

Martin, J. E., at al., "Sintering of Alkanethiol-Capped Gold and Platinum Nanoclusters", J. Phys. Chem. B, vol. 107, pp. 430-434 (2003).

Müller, A. D., et al., "Localized electrochemical deposition of metals using micropipettes", Thin Solid Films, vol. 366, pp. 32-36 (2000).

Peckerar, M. C., et al., "Issues in Nanolithography for Quantum Effect Device Manufacture", Handbook of Microlithography, Micromachining, and Microfabrication, SPIE Optical Engineering Press, Bellingham, WA, Chptr. 8, vol. I, pp. 681-763 (1997).

Senturia, S. D., Microsystem Design, Kluwer Academic Publishers, Norwell, MA, pp. 50-57 (2001).

Skinner, J. G., et al., "Photomask Fabrication Procedures and Limitations", Handbook of Microlithography, Micromachining, and Microfabrication, SPIE Optical Engineering Press, Bellingham, WA, vol. I, Chptr. 5, pp. 377-474 (1997).

Stellacci, F., et al., "Laser and Electron-Beam Induced Growth of Nanoparticles for 2D and 3D Metal Patterning", Adv. Mater., vol. 14, No. 3, pp. 194-198 (2002).

Su, M., et al., "Moving beyond Molecules: Patterning Solid-State Features via Dip-Pen Nanolithography with Sol-Based Inks", J. Am. Chem. Soc., vol. 124, No. 8,. pp. 1560-1561 (2002).

Tsubokawa, N., et al., "Carbon Black/Alumina Gel Composite: Preparation by Sol-Gel Process in the Presence of Polymer-Grafted Carbon Black and Its Electric Properties", J. Poly. Sci. Part A-Polymer Chemistry, vol. 37, No. 18, pp. 3591-3597 (1999).

Wang, X., et al., "Scanning Probe Contact Printing", Langmuir, vol. 19, pp. 8951-8955 (2003).

Wasson, J. R., et al., "Writing, repairing, and inspecting of extreme ultraviolet lithography reticles considering the impact of the materials", J. Vac. Sci. Technol. B, vol. 19, No. 6, pp. 2635-2640 (2001).

Wilbur, J. L., et al., 'Microfabrication by Microcontact Printing of Self-Assembled Monolayers, Adv. Mater., vol. 6, No. 7/8, pp. 600-604 (1994).

Wilson, O., et al., "Laser Writing in Polarized Silver Nanorod Films", Adv. Mater., vol. 14, No. 13, pp. 1000-1004 (2002).

Wolf, S., et al., *Silicon Processing for the VLSI Era*, Lattice press, Sunset Beach, CA, pp. 485-486 (1986).

Wuelfing, W. P., et al., "Monolayer-Protected Clusters: Molecular Precursors to Metal Films", Chem. Mater., vol. 13, pp. 87-95 (2001).

Zhang, W., et al., "Multilevel nanopimprint lithography with submicron alignment over 4 in. Si wafers", Appl. Phys. Letts., vol. 79, No. 6, pp. 845-847 (2001).

* cited by examiner

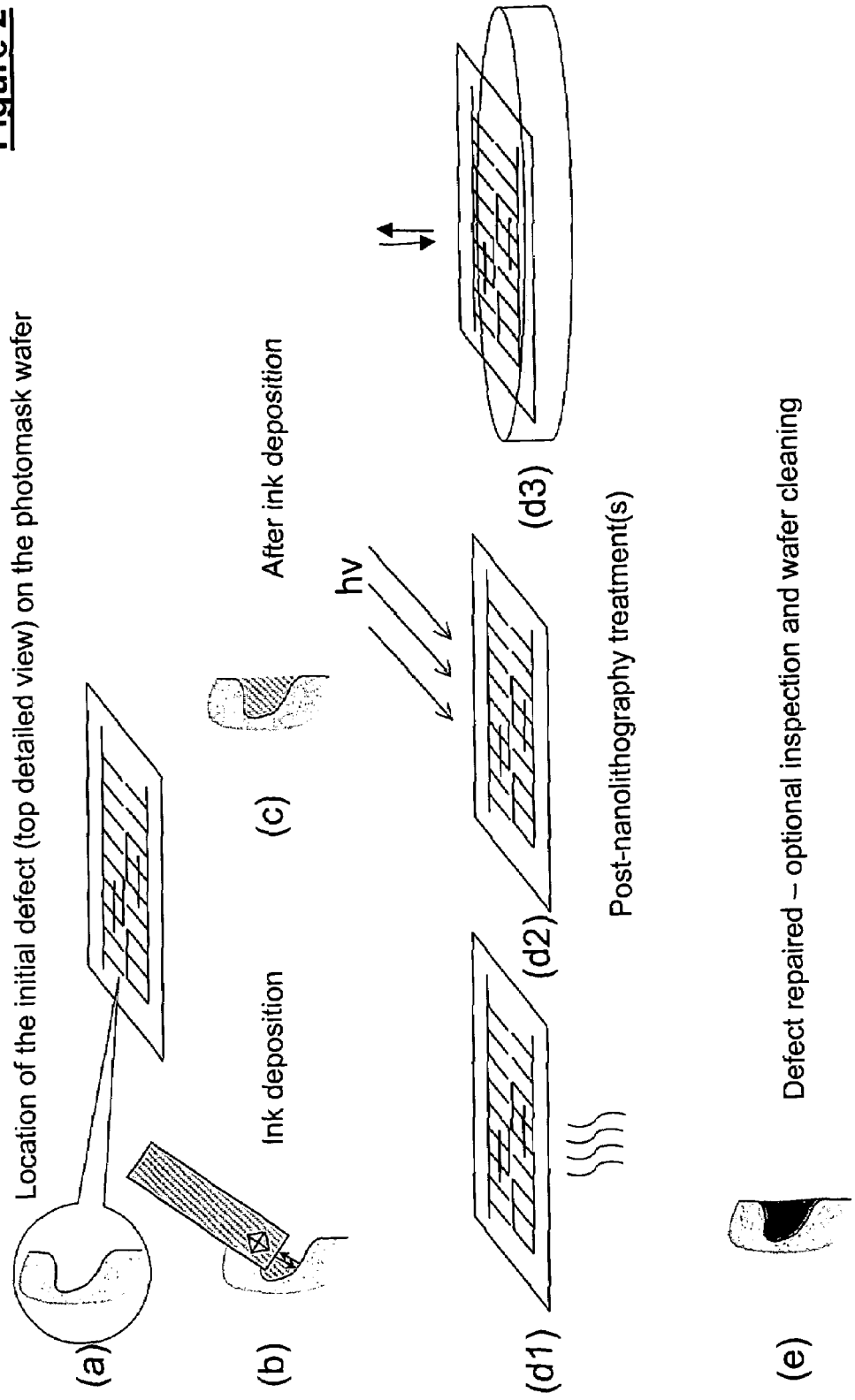

(a) Pd²⁺ patterns on Si/SiOx (b) Pd metal patterns on Si/SiOx (c) Line scan indicating height of metal dots

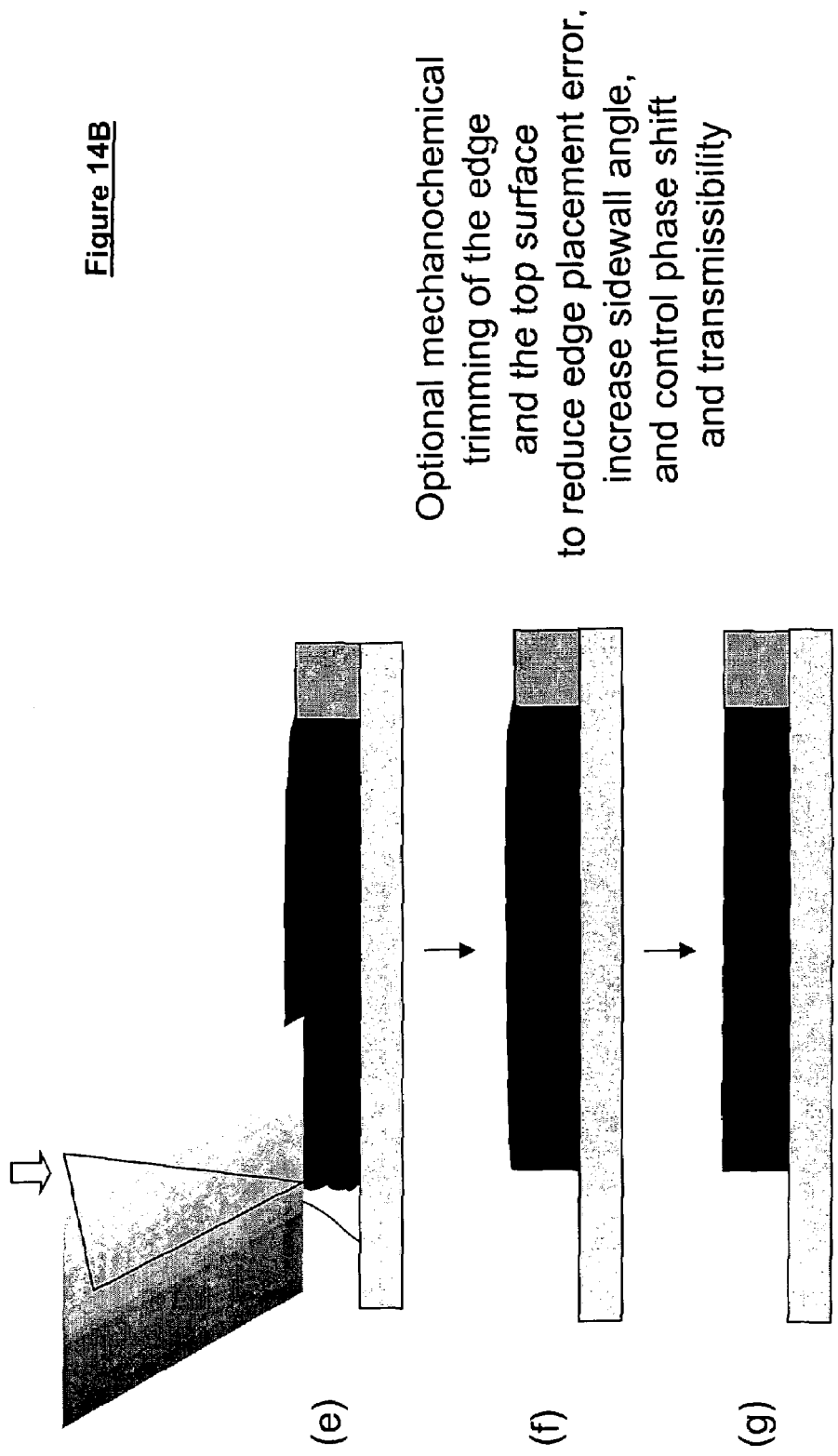

Zoomed Out View

- Sol-Gel Structures in one of the smallest features in Binary Mask
- The features (5 holes) in the mask are 1μm x 2μm.
- Nano Structures were successfully created in smaller features too.

Figure 16
Shown was the target feature to be used for deposition of Sol-Gel structures
The dimensions of the hole are
Length 2 µm
Width 1 µm
Height 75 nm
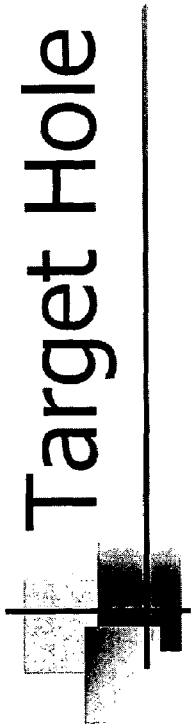
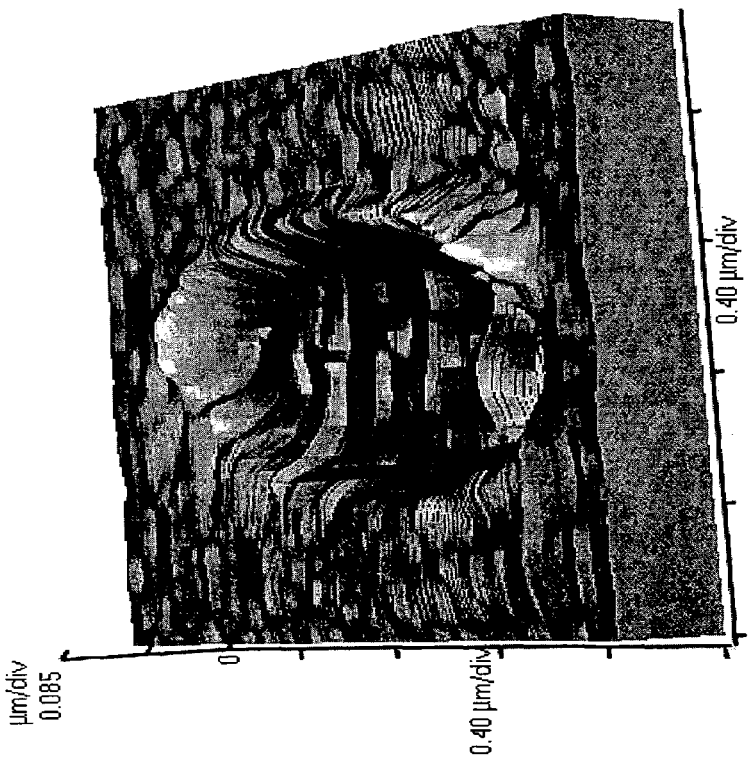

Dots in the Features

Dots were created, demonstrating the control over height of the feature and the registration. The dimensions starting from top feature

- H 17nm W 128 nm T 3 min
- H 17.5 nm W 150 nm T 3.5 min
- H 18.5 nm W 163 nm T 4 min A dot 45.3 nm tall was created by holding the tip coated with sol-gel for 15 min. This demonstrates ability to create very high nano structures without loosing control over x and y dimensions.

Lines in the Feature

These three lines were created, one exactly alongside the defect edge. The dimensions for the lines starting from left are:

1. H 15 nm W 162 nm T 6 min
2. H 10 nm W 150 nm T 5 min
3. H 5 nm W 138 nm T 4 min

Sol-Gel in Features by FIBICS

An attempt to fill up a hole in features made with FIB. The average height of the feature deposited is 46 nm. A $SiN_3$ tip was used in this experiment.

Sol-Gel composition same as mentioned before. Dwelling time was 14 min. The deposited structure were cured at 120° C for 6 min.

Optical Microscopy Image of a PDMS-Coated DPN Stamp Tip

METHODS FOR ADDITIVE REPAIR OF PHASE SHIFT MASKS BY SELECTIVELY DEPOSITING NANOMETER-SCALE ENGINEERED STRUCTURES ON DEFECTIVE PHASE SHIFTERS

RELATED APPLICATIONS

This application claims priority benefit to provisional application 60/419,781 filed Oct. 21, 2002 to Crocker et al. ("Nanometer-scale engineered structures, methods and apparatus for fabrication thereof, and applications to photomask repair and enhancement"), which is hereby incorporated by reference in its entirety.

INTRODUCTION

The present invention relates in general to the engineering of nanometer-scale structures and, in particular, to the repair and fabrication of masks used for lithography. Applications include the semiconductor industry.

Masks including photomasks are important to the semiconductor industry. Photomask fabrication and repair is an important technology in the semiconductor industry for microchip/integregrated circuit (IC) production by microlithography. See, for example, *Handbook of Microlithography, Micromachining, and Microfabrication*, Vol. I and II, including Vol. I, Chapter 5 "Photomask Fabrication Procedures and Limitations" by Skinner et al. (pages 377-474). A typical photomask (or reticle) used in conventional deep-UV optical lithography comprises an optically transparent substrate containing thereon a mask layer which is an optically opaque pattern. Light passes through the non-opaque regions only, generating a pattern below the photomask. In other words, the mask is illuminated, projecting an image on a wafer coated with a photoresist. Typically, photomasks are expensive and complex, and some photomasks contain defects. There exists, therefore, a strong economic incentive to repair these defects.

Common mask defects, as illustrated in FIG. 1, for example, are classified by their influence on the aerial image (the optical pattern that is generated by illumination through the mask):

1—Opaque defects, which are extraneous (spurious) features typically to be repaired by a subtractive method; for example, they include opaque spots or blobs in areas to be left transparent, unwanted necks or bridges between features, unwanted spikes or protuberances on the side of features.

2—Clear defects, which are missing or incomplete features, typically to be repaired by an additive method; they include pin-holes, broken or thinned lines, notches, and corner defects.

Defects may occur in the mask layer (e.g. Cr metal or $MoSi_2$) or in the substrate (e.g. quartz bumps or divots).

Mask defects can further be classified as hard vs. soft defects, as disclosed in the aforementioned Skinner article. A soft defect is typically any defect that can be removed by a cleaning process, whereas a hard defect cannot be removed by a cleaning process. Typically, for example, particles, contamination, residue, stains, etc. on the chrome/quartz would be called soft defects. Also, missing or extra features in the chrome/absorber/phase shifter (see below) e.g., pinholes, quartz pits, etc. would be called hard defects. Types of hard defects include, for example, pinholes, pinspots, intrusions, corner defects, missing features, absorber transmission defects, protrusions, and semi-transparent defects in a clear area.

Other types of defects include those that result from errors in the original mask data tape and also mask misprocessing (misplacement and missizing of geometries; those that result from CD (critical dimension) variations across the masks and edge quality of features, i.e., line edge roughness.

In the present invention, these and other types of defects can be repaired by improved means of nanolithography and nanodeposition which, among other things, can add material to the mask, or can add materials to and substract materials from the mask. In addition, mask features can be enhanced to include features that may improve performance (e.g., resolution) but are not necessarily patterned or printed. Enhancement features can be, for example, 100 nm structures or less in lateral dimension.

The present invention relates to nanometer-scale deposition and removal methods that use direct write deposition nanolithography, including nanolithography based on scanning probe microscopic methods and atomic force microscopic methods, and especially DIP PEN NANOLITHOGRAPHY™ (DPN™) printing and deposition methods, as an important step (DPN™ and DIP PEN NANOLITHOGRAPHY™ are trademarks of NanoInk, Inc., Chicago, Ill.). The DPN™ deposition and printing methods are disclosed for example in (1) U.S. Patent Publication No. 2002/0063212 A1 published to Mirkin et al. on May 30, 2002, and (2) U.S. Patent Publication No. 2002/0122873 A1 published to Mirkin et al. on Sep. 5, 2002, the complete disclosures of which are hereby incorporated by reference, particularly for the experimental parameters for the nanolithography, including substrates, inks, patterning compounds, tip, instrumentation, software, and the like, and the variety of embodiments and applications which can be carried out.

The present invention further relates to (1) the afore-mentioned methods; (2) the apparatus implementing or enabling them; and (3) the articles produced by these methods, which are engineered nanometer-scale features placed with nanometer-scale precision.

More particularly, the present invention relates to the use of the afore-mentioned articles, methods and apparatus to (a) fabricate, repair, and enhance masks and photomasks; (b) modify microelectronic devices or microsystems (MEMS), and (c) to create masks, microelectronic devices or MEMS. The acronym "MEMS" for purposes of the present disclosure can encompass all microsystems, whether microelectromechanical, microelectrooptical, microelectromagnetic, microfluidic . . . in nature, and disregarding their critical dimension (i.e. including nanoelectromechanical systems, NEMS).

Microchips are most commonly commercially produced using optical lithography, a process in which a photosensitive resist is spun on the substrate for patterning and then selectively exposed by UV light through a photomask or reticle. The need for more sophisticated, faster and denser devices has reduced the minimum feature size in microchips (the critical dimension, CD) by a 0.7 factor every three years a model known as Moore's law ["International Roadmap for Semiconductors (Lithography)", International SEMATEC, 2000]. The minimum feature size and spacing in the photomasks used to fabricate them has shrunk proportionally. However, photomask feature dimensions are currently approaching their theoretical physical limit. Quantum effects such as tunneling and particle-wave interference effects can become important for device performance as shrinking continues to nanometer scales. Photomasks are thus increasingly precise, complex (with the addition of optical phase correction (OPC) and the use of techniques such as phase shifting and off-axis illumination, OAI) and therefore increasingly expensive, for example, typically above $50,000 per unit for alternating phase shift masks. A different photomask is required for each lithography exposure, in other words for each layer in the microchip. More than a dozen masks may be required for some designs. Lithography thus represents one of the largest fixed costs associated with chip production (typically, approx. ⅓ of the total). The total cost for a 90-nm mask can be about one million dollars.

In addition, even minor defects on the photomasks may result in a global failure of the resulting microchips or may reduce dramatically their mean time before failure. For example, a single extraneous opaque imperfection located between two printed lines on the photomask may result in an electrical short between two electrical paths, triggering a major defect or breakdown of the whole chip. Given the expenses and stringent quality requirements associated with photomasks, it is economically advantageous to (a) repair masks presenting defects after fabrication or after use; (b) modify masks otherwise rendered unusable because of a minor error at design time. It is also important to consider cheaper, more reliable alternatives to current photomask fabrication methods.

Currently used photomask repair processes are either extremely expensive, limited, or not well adapted to advanced mask technologies. The most commonly used tool, focused ion bam (FIB), which is capable of etching opaque defects and filling clear ones with carbon or metal deposits [see, for example, Tao et al., U.S. Pat. No. 5,104,684, 1992], and may cost above $5M per unit (see e.g. Veeco FBI commercial instruments). While this technology can work for COG (Chromium on glass), despite poor edge placement accuracy, repair technologies based on gallium staining are known to damage the areas surrounding the defect in attenuating phase shifting masks. Laser ablation and laser-assisted deposition is also used [see for example Balz et al., U.S. Pat. No. 5,441,836, 1995 and references therein] [Segal et al., U.S. Pat. No. 4,200,668 1980] [Chiba et al., Japanese Journal of Applied Physics part 1 38 (12A): 6577-6582, 1999 and references therein].

Less costly but purely subtractive photomask repair tools based upon scanning probe microscopy are also available (See for example instruments being commercialized by Rave LLC, and U.S. Pat. No. 6,353,219 to Kley (Mar. 5, 2002)). A nanobit, i.e. a cantilever with a high force constant terminated by a sharp, resilient tip, can be used to mechanically scratch away the spurious parts. Thus far, additive repair with this tool can only be accomplished by successive deposition of large carbon patches using e.g. focused ion beam (FIB) and then trimming of excess material from the patch. Similar subtractive-only technology using a laser beam delivered by a scanning near-field optical microscopy probe is being developed (Instruments developed by Nanonics, Israel).

There is therefore a need to develop a technology that will be capable of both additive and subtractive repair, while maintaining the cost and precision advantages of e.g. nanomachining. In the following sections, it is demonstrated that such alternative can be developed using deposition nanolithography techniques, such as Dip Pen™ Nanolithographic printing, as a preferred patterning method.

Current reticle technologies include binary photomasks (Chromium on glass, COG) and phase shifting masks. Binary photomasks are typically fabricated by deposition of opaque metallic chromium (or aluminum or nickel) on a transparent substrate (e.g. quartz, sapphire, glass). A typical process for binary chromium masks starts with 5 inch fused silica square plates coated with a thin film of chromium and a resist. The resist is exposed with an optical pattern generator, in case of a photoresist, or with an electron beam lithography tool, in case of an electron-beam resist (e.g. PMMA). The resist is then developed and the chromium etched ["Microsystem design", S. Senturia, 2001, pages 50-57]. COG photomask repair technology thus focuses on the deposition of opaque patches in the location of clear defects and the removal of chromium left in unwanted areas.

Phase shifting masks (PSM) take advantage of destructive interference at pattern edges to improve contrast. Alternating Aperture PSMs, also called strong-shifters are fabricated by etching 180°-phase-shifting windows in alternating clear areas of the quartz mask. Repair technologies in this area focus on substrate defects (quartz bumps and divots) ["Alternating phase shift mask defect printability for 130 nm and 100 nm KrF lithography", Kim et al., International SEMATECH, May 19, 2000].

Attenuating PSMs (having weak-shifters) rely on the deposition of a partially transmitting, 180°-phase-shifting material (e.g. molybdenum silicide). Light diffracted from a clear opening in the photomask will destructively interfere with light from the phase-shifted areas, improving contrast. Additive repair of such photomasks relies on the deposition of a layer with similar overall optical properties (transparency, index of refraction), which may be achieved by precise control of the chemistry and the thickness of the patch.

Newer lithographies increasingly can be considered to be nanolithography as opposed to microlithography and may combine 193 nm and 157 nm technologies and what is called Next Generation Lithographies (NGL), the primary contenders including Extreme UV (EUV, 14.6 nm), electron projection lithography (EPL), including SCAPEL, and X-ray lithography. EUV masks will likely consist of diffractive reflectors containing as many as 40 layers (e.g. Mo/Si). This makes defect inspection and repair absolutely critical. Also, in contrast with photomasks, which have a 4:1 or 5:1 mask-to-wafer ratio, NGL masks are often 1:1. A high-precision tool, capable of nanometer-scale XY control and able to process multiple layers with high Z resolution is therefore required for the fabrication and repair of masks for emerging lithographies.

Chapter 8 of the *Handbook of Microlithography, Micromachining, and Microfabrication*, Vol. I, by Peckerar et al. "Issues in Nanolithography for Quantum Effect Device Manufacture (pages 681-763) discloses Proximal Probe Electron Lithography (pages 710-716), which is hereby incorporated by reference.

A need exists for facile, rapid, versatile, and cost-effective methods to fabricate, enhance, and repair mask, photomasks, and similar structures having defects and holes, particularly at nanoscopic dimensions, and particularly in additive mode wherein very small amounts of material are added to effect repair. A further need exists for these methods to be compatible with existing and newer photomask technologies.

SUMMARY

In this section, the invention is summarized, although this summary should not limit the invention which is described in detail and claimed below.

The invention provides a method for additive repair in the semiconductor industry with fine control over lateral dimensions and height comprising: depositing material to a defective mask by direct write nanolithography from a tip for additive repair.

The invention also provides a method for nanolithography comprising: (1) providing a mask, (2) providing a scanning probe microscope tip, wherein the tip is coated with a patterning compound, (3) contacting the coated tip with the mask so that the compound is applied to the mask.

The invention also provides a method for nanolithography comprising: (1) providing a substrate having at least one defect, (2) providing a tip with a patterning compound, (3) using the tip with the substrate so that the compound is applied to the substrate at the defect to repair the defect.

The invention also provides a method for mask fabrication comprising adding material to a substrate to form a mask by direct write nanolithography with use of a scanning probe microscopic tip to pattern material on the substrate.

The invention also provides a method of nanolithography comprising using a tip to layer one or more patterning compounds on a substrate so the one or more patterning compounds form a structure at least about 10 nm high. The structure can be a mask enhancement structure.

The invention also provides a method for nanolithography comprising using a coated atomic force microscope tip to deposit a patterning compound on a substrate in mask fabrication.

The invention also encompasses masks repaired, enhanced, and fabricated by these methods. The invention also provides methods of using scanning probe microscopy to repair and fabricate masks by additive repair and additive lithography, respectively.

Another aspect of the invention is a repaired photomask comprising a defective mask substrate comprising at least one nanometer-scale opening which is a defect, and at least one additive repair nanostructure at least partially filling the opening. The nanostructure can also substantially fill the opening.

The present invention also provides (i) engineered nanometer-scale deposits placed with nanometer-scale accuracy; and in particular (ii) engineered nanometer-scale etched openings (as disclosed herein) and similar objects; (iii) engineered nanometer-scale filled openings and similar objects; (iv) structures or assemblies containing such objects; (v) methods for preparing (etching/depositing/filling) and using nanometer-scale deposits and their assemblies, alone or in combination with other objects; (vi) apparatus to fabricate such objects.

More specifically, the following articles and methods are part of the invention: (vii) nanometer-scale deposits or openings etched or filled by a process that utilizes a direct write deposition nanolithography technique, and in particular (viii) nanometer-scale deposits formed (or openings etched or filled) by direct write, Dip Pen™ Nanolithographic printing and deposition (DPN™); (ix) methods of fabricating such features, including (x) pre-nanolithography treatments (e.g. solvent or plasma cleaning, adhesion layer deposition), (xi) nanolithography methodology (including ink composition and its delivery to the probe), and (xii) post-nanolithography processes (e.g. reduction, thermal treatment, curing . . . ); each treatment being applied in-situ or ex-situ, once or multiple times, with or without repetition; as well as (xiii) the apparatus(es) to do so.

Examples include but are not limited to (xiv) the deposition of and/or filling with e.g. (a) a metal-rich material, such a metal or an alloy, and precursors thereof; (b) a carbon-rich material, such as graphite-like carbon (including fullerenes and carbon nanotubes and carbon nanotube derivatives), and diamond-like carbon; (c) colloidal particles, including metallic ones; and mixtures containing thereof, (d) one or more high-molecular-weight compound(s), including organic and inorganic polymers, with or without the addition of colloidal particles; (xv) the deposition of metal oxide, glasses, silicates and related materials; (xvi) the sequential deposition/filling materials according to xiv) and xv) (multilayer formation) with, optionally, control of the thickness and roughness of each layer, as well as the edge geometry.

Practical applications include (xvii) the filling of a nanometer-scale opening of a feature with a material having similar optical properties (including index of refraction, absorbance, and reflectivity) to the surroundings of the openings, including (xviii) the filling of a nanometer-scale opening with or nanometer-scale deposition of a material opaque to electromagnetic radiation, including visible and UV light, and/or charged particles; and in particular (xix) the repair of defects in microfabricated structures and their assemblies; (xx) the repair of defects present in optical lithography photomasks and (xxi) in microelectronic chips and microelectromechanical systems (MEMS).

Other aspects of this disclosure include, for example:

(xxii) the methods that associate the articles and methods described above with (a) other substrate modification methods, in particular (b) other photomask repair methods, including (c) subtractive repair methods capable of removing features by (electro)chemical etching, mechanical removal, local heating, laser ablation/evaporation, ion etching or a combination thereof; in particular (d) subtractive nanomachining processes; and (e) subtractive nanomachining processes, in which the removal is assisted by the deposition of a lubricant or etchant esp. using DPN™ printing as the source;

(xxiii) the apparatus implementing the above methods; (xxiv) the combination of the methods or apparatus described above and of methods or apparatus designed to detect defects and their influence on wafer printing. The latter includes methods and apparatus based upon the principles of optical microscopy (including stepper equivalents) and scanning probe microscopy, including SPM of a large area via a large array of probes.

DPN™ printing- and deposition-based processes may also be used for (xxv) contamination control by local delivery of a cleaning agent or solvent, or by combination of mild mechanical removal and reagent deposition.

It is another object of the invention to provide methods (xxvi) to enhance a mask made by conventional methods with features otherwise difficult to fabricate, (xxvii) by addition of OPC (optical proximity correction) features. It is known that image fidelity issues with optical pattern generators limit their usefulness for the patterning of high-density features and sub-resolution OPC features, such as scattering bars. DPN™ patterning with parallel probe arrays may compete effectively with e-beam direct writing, in term of overall costs and throughput, for the fabrication of wavefront engineering features, such as OPC and PSM features.

It is another object of the present invention (xxviii) to provide DPN™ printing- and deposition-based methods and apparatus suitable as the principal technology to pattern photomask wafers, including through the use of high-throughput probe arrays. Among key advantages of DPN™ printing and deposition is its ability to fabricate nanostructures, such as networks of nanodots or lines, within micron-scale areas (e.g. the mask patterns), giving the mask designer access to the unique optical properties of low-dimensional systems.

Other applications include but are not limited to (xxix) the modification of magnetic read/write heads for hard drives; and (xxx) the fabrication or modification of probes, such as scanning probe microscopy/lithography probes, DPN™ printing and deposition probe or probe arrays;

Advancing these technologies requires the development of (xxxi) novel probe geometries, (xxxii) novel probe positioning/actuation technologies, (xxxiii) novel probe arraying and multiplexing technologies; (xxxiv) novel methods of ink delivery to the probe, as well as (xxxv) methods to assess the suitability of fabricated patterns, e.g. their mechanical and chemical performances and their stability in following processing steps.

BRIEF DESCRIPTION OF THE DRAWINGS

FIG. 2 illustrates repair of defects including location of the defect and ink deposition steps.

FIGS. 14A and 14B illustrate multilayered patterning.

FIG. 16 shows defective mask structures (closer view).

DETAILED DESCRIPTION

Figure 1:
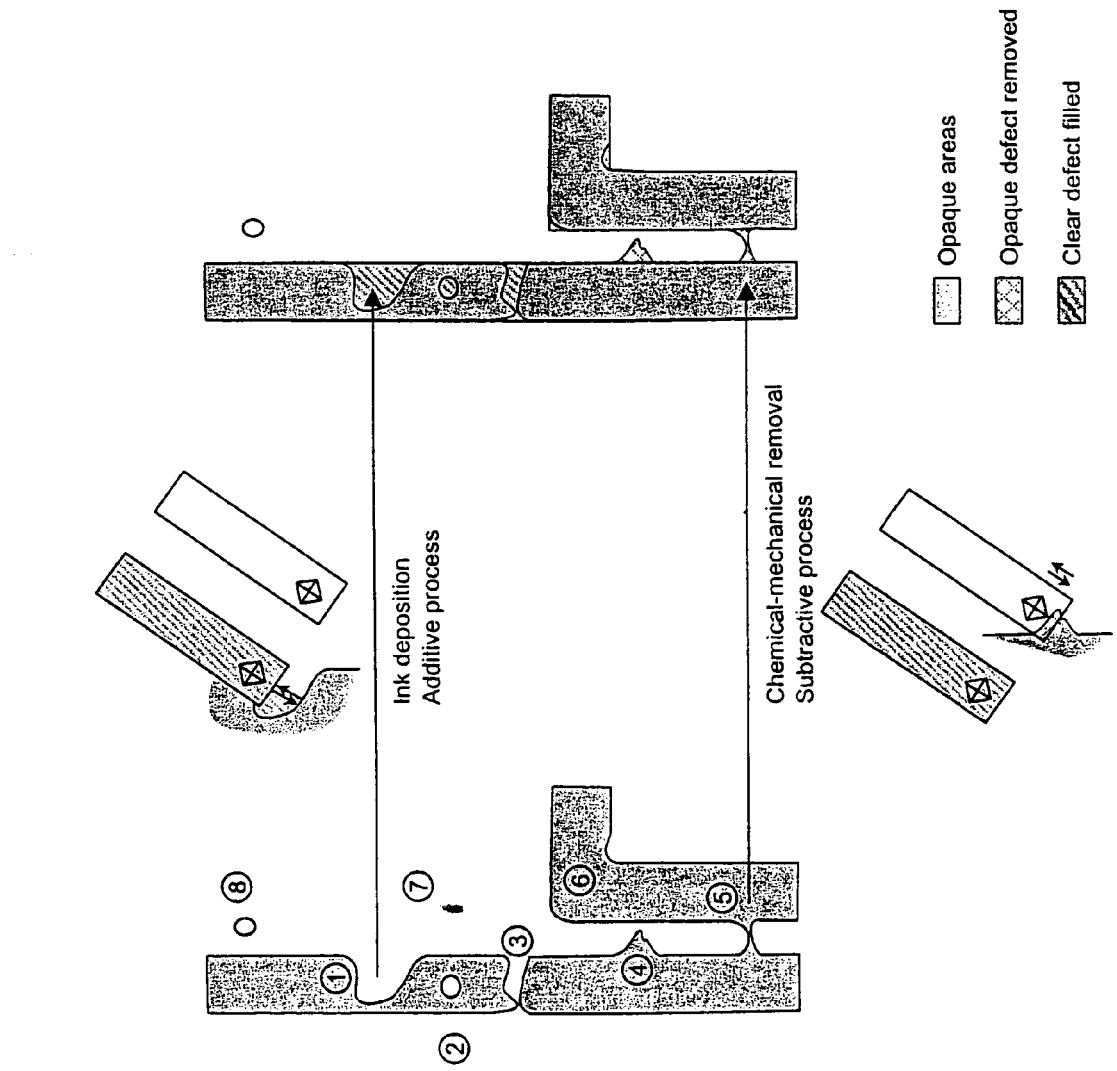
FIG. 1 illustrates different types of mask defects and additive and subtractive repairs.

This application claims priority benefit to provisional application 60/419,781 filed Oct. 21, 2002 to Crocker et al. ("Nanometer-scale engineered structures, methods and apparatus for fabrication thereof, and applications to photomask repair and enhancement"), which is hereby incorporated by reference in its entirety. The references cited in the introduction section can be referred to in the practice of the present invention. No admission is made that any reference cited in this patent application, including in the introduction section, is prior art.

I. Direct Write Nanolithography and Use of Tips

The present invention provides nanometer-scale functional features (including deposits, filled openings, and etched openings), as well as the enabling methods and apparatus. Examples of specific features to be fabricated and repaired include:

(a) Defect repair patches in transmission photomasks and reflection photomasks such as these used for extreme UV lithography; this includes the deposition of opaque or transparent materials, or their etching.

(b) Vias, lines and defect thereof, in microelectronic circuits, the application being the repair of high-value chips;

(c) Filled defects in microelectromechanical systems (MEMS), the application being the repair, modification or testing of prototypes.

The present invention also provides the methods and apparatus (a) for the modification of existing photomasks, as a corrective measure or as an enhancement measure; (b) for the fabrication of photomasks;

Dip Pen™ Nanolithographic printing and deposition (DPN™ printing and deposition) can be used in conjunction with novel inks, probes, pre-/post-deposition and ink delivery methods. DPN™ printing and deposition, built upon the technique of Atomic Force Microscopy (AFM) allows the deposition of one or more inks with nanometer scale precision, enabling the fabrication, on a variety of surfaces, of insulator, semiconductor, and metallic nanostructures with tailorable physical properties and fine control over lateral dimensions (several nanometers to many microns) and height (angstroms to hundreds of nanometers).

Specifically, the following attributes position DPN™ printing as a powerful technique for a new additive mask repair and fabrication technique at unprecedented resolution:

1. High resolution. By optimizing particular ink/substrate combinations feature sizes as small as 12 nm with spatial resolution of ~5 nm can be achieved.
2. Works in ambient environment DPN™ printing and deposition utilizes ink transport from a coated probe to a substrate in ambient environment conditions of temperature, pressure and humidity. In general, there is no need for high vacuum conditions.
3. Direct writing. No resists are needed and the molecules of interest can be placed exactly (and only) where desired, thereby minimizing contamination and alteration of the rest of the substrate. This ability also allows in situ deposition of multiple inks on a substrate.

Chemical generality. DPN™ printing and deposition to pattern inks can be used with compounds ranging from simple organic molecules (such as alkanethiols) to oxides and metals and nanoparticles on surfaces ranging from gold to oxides to semiconductors.

The present invention consists essentially of these and other basic and novel features.

DPN™ printing and deposition methods are extensively described in the following patent applications and patent publications, which are hereby incorporated by reference in their entirety, particularly with respect to the experimental parameters for carrying out the deposition:

1. U.S. Provisional application 60/115,133 filed Jan. 7, 1999 ("Dip Pen Nanolithography").
2. U.S. Provisional application 60/157,633 filed Oct. 4, 1999 ("Methods Utilizing Scanning Probe Microscope Tips and Products Therefor or Produced Thereby").
3. U.S. Regular patent application Ser. No. 09/477,997 filed Jan. 5, 2000 ("Methods Utilizing Scanning Probe Microscope Tips and Products Therefor or Produced Thereby").
4. U.S. Provisional application 60/207,713 filed May 26, 2000 ("Methods Utilizing Scanning Probe Microscope Tips and Products Therefor or Produced Thereby").
5. U.S. Provisional application 60/207,711 filed May 26, 2000 ("Methods Utilizing Scanning Probe Microscope Tips and Products Therefor or Produced Thereby").
6. U.S. Regular application Ser. No. 09/866,533 filed May 24, 2001 ("Methods Utilizing Scanning Probe Microscope Tips and Products Therefor or Produced Thereby").

7. U.S. patent publication number 2002/0063212 A1 published May 30, 2002 ("Methods Utilizing Scanning Probe Microscope Tips and Products Therefor or Produced Thereby").
8. U.S. patent publication number 2002/0122873 A1 published Sep. 5, 2002 ("Nanolithography Methods and Products Produced Therefor and Produced Thereby").
9. PCT publication number WO 00/41213 A1 published Jul. 13, 2000 based on PCT application no. PCT/US00/00319 filed Jan. 7, 2000 ("Methods Utilizing Scanning Probe Microscope Tips and Products Therefor or Produced Thereby").
10. PCT publication number WO 01/91855 A1 published Dec. 6, 2001 based on PCT application no. PCT/US01/17067 filed May 25, 2001 ("Methods Utilizing Scanning Probe Microscope Tips and Products Therefor or Produced Thereby").
11. U.S. Provisional application 60/326,767 filed Oct. 2, 2001, ("Protein Arrays with Nanoscopic Features Generated by Dip-Pen Nanolithography").
12. U.S. Provisional application 60/337,598 filed Nov. 30, 2001, ("Patterning of Nucleic Acids by Dip-Pen Nanolithography").
13. U.S. Provisional application 60/341,614 filed Dec. 17, 2001, ("Patterning of Solid State Features by Dip-Pen Nanolithography").
14. U.S. Provisional application 60/367,514 filed Mar. 27, 2002, ("Method and Apparatus for Aligning Patterns on a Substrate").
15. U.S. Provisional application 60/379,755 filed May 14, 2002, ("Nanolithographic Calibration Methods").
16. U.S. Regular application Ser. No. 10/647,430 filed Aug. 26, 2003 ("Processes for Fabricating Conductive Patterns Using Nanolithography as a Patterning Tool") describes conductive compositions and patterning thereof.
17. U.S. Provisional Application 60/425,252 filed Nov. 12, 2003 ("Methods and Apparatus for Ink Delivery to Nanolithographic Probe Systems") to Cruchon-Dupeyrat et al.

Another illustration of the DPN methods can be found in the patent publication, 2003/0022470 to Chang Liu et al. published Jan. 30, 2003 ("Parallel, Individually Addressable Probes for Nanolithography"), which is hereby incorporated by reference.

DPN™ printing and deposition-related products, including hardware, software, and instrumentation are also available from NanoInk, Inc. (Chicago, Ill.).

II. Mask Repair and Fabrication

Mask fabrication and repair is disclosed in the following patents, which are hereby incorporated by reference in their entirety, particularly for their disclosure on the materials of the photomask and repair: U.S. Pat. No. 6,090,507 to Grenon et al. (Jul. 18, 2000); U.S. Pat. No. 6,165,649 to Grenon et al. (Dec. 26, 2000); U.S. Pat. No. 6,373,976 to Pierrat et al. (Apr. 16, 2002); U.S. Pat. No. 6,139,993 to Lee et al. (Oct. 31, 2000); U.S. Pat. No. 4,727,234 to Oprysko et al. (Feb. 23, 1988); U.S. Pat. No. 6,096,459 to Yang (Aug. 1, 2000); U.S. Pat. No. 6,114,073 to Yang (Sep. 5, 2000); U.S. Pat. No. 4,200,668 to Segal et al. (Apr. 29, 1980); and U.S. Pat. No. 6,353,219 to Kley (Mar. 5, 2002).

In addition, U.S. Pat. No. 6,451,375 to Cotte et al. (Sep. 17, 2002) is incorporated by reference in its entirety, particularly for its disclosure on depositing films on nanometer structures using supercritical fluid technology.

Also, U.S. Pat. No. 4,160,049 to Narcus (Jul. 3, 1979) is incorporated by reference in its entirety, particularly for its disclosure on electroless deposition of nickel coatings.

In addition, the following text is incorporated by reference in its entirety: *Handbook of Microlithography, Micromachining, and Microfabrication*, Vol. I and II, including Vol. I, Chapter 5 "Photomask Fabrication Procedures and Limitations" by Skinner et al. (pages 377-474), particularly for its discussion of substrate preparation, pattern writing, pattern processing, metrology, inspection for pattern integrity, cleaning, repair, pellicle attachment, final defect inspection, and materials. Also, Chapter 8 of this book written by Peckerar et al., discussed above, is incorporated by reference in its entirety, particularly for its disclosure about proximal probe lithography.

Repairing defects in masks and reticles is also disclosed in *Silicon Processing for the VLSI Era Vol. I: Process Technology*, pgs. 485-486, Wolf and Tauber, 1986, which is hereby incorporated by reference in its entirety.

For advanced mask repair, the following references can be used: "Issues for advanced reticle fabrication: (You Want that reticle when?)", J. G. Maltabes, *Future Fab.*, Vol. 11, Jun. 29, 2001.

FIG. 1 provides a schematic diagram of common mask defects, including photomask defects, before (left-hand side) and after repair (right-hand side): (1) thinned line or edge notch; (2) pin-hole defect; (3) gap; (4) spike or protuberance; (5) bridge or neck; (6) corner defect; (7) bump or divot in the (quartz) substrate; (8) spurious opaque spot. Clear defects may be repaired by an additive process, such as deposition of an ink (top), while opaque defects may be removed by a subtractive process (bottom), for example, the deposition of a chemical etchant, assisted or not by mechanical action.

A defect can be a flaw, an imperfection and/or a weakness. It refers for example to:

a—an unwanted opening (as defined above) within an engineered feature;

b—an unwanted spot, protuberance or spike;

c—a bridge or neck between two engineered features;

d—an anomaly of the thickness of the substrate or its light-propagating properties;

For purposes of this disclosure, a nanometer-scale feature can be an object, one dimension of which (at least) is (a) less than a few micrometers but more than 500 nm (nanometers); (b) less than 500 nm but more than 100 nm; (c) less than 100 nm but more than 10 nm; or (d) less than 10 nm down to molecular dimensions.

Moreover, an opening can be (1) an area where something is missing; (2) a hollow between ridges or protuberances. It can include, but is not limited to: (a) a hole, perforation or aperture; (b) a gap; (c) a recess, indentation or cavity; (d) a fissure, crack or break.

In this invention, the partial or substantially complete fillings of openings having a lateral dimension of about 100 nm or less, about 80 nm or less, about 56 nm, or less, or about 35 nm or less, are particularly preferred, based on projected semiconductor nodes.

Figure 3A:
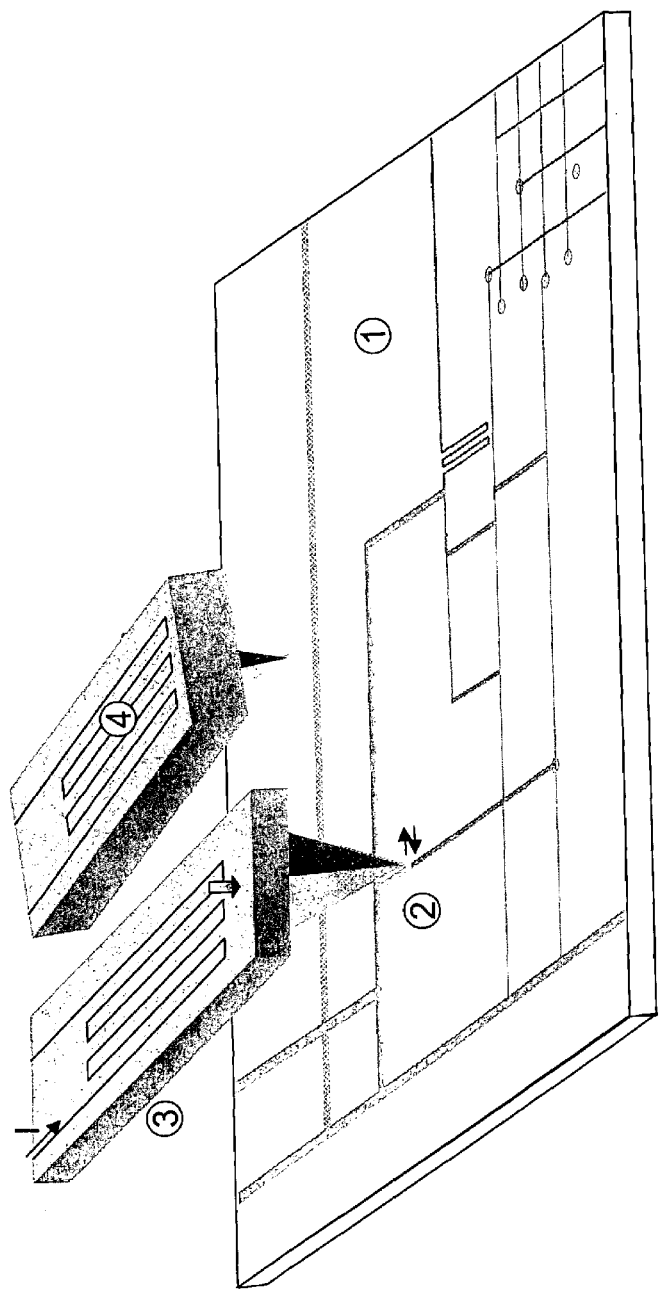
FIGS. 3A and 3B illustrate additive and subtractive repair.
Figure 3B:
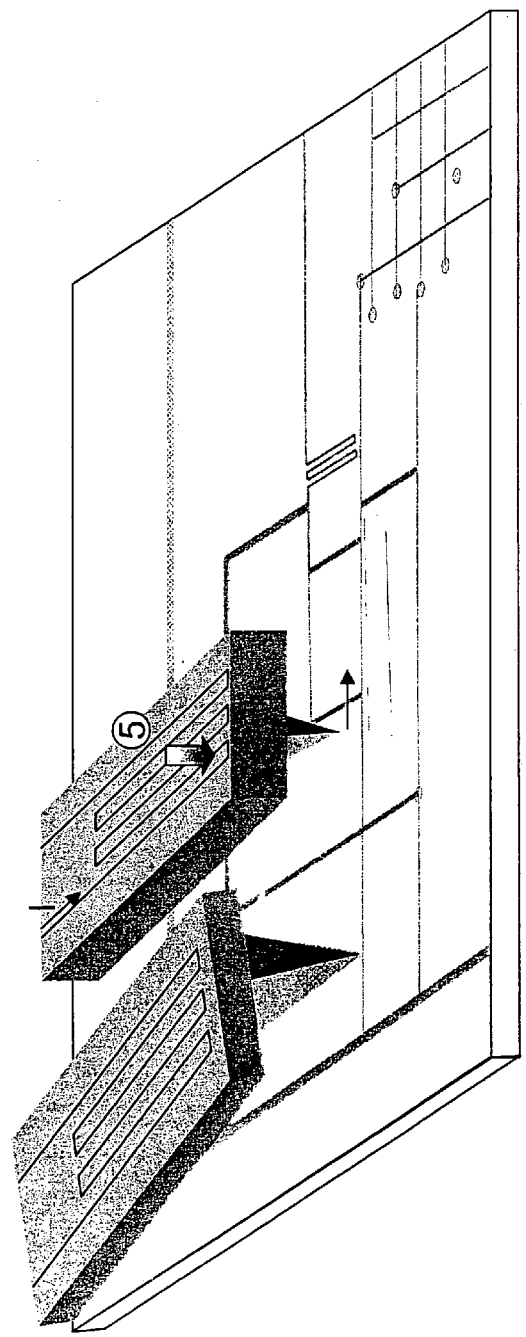

III. FIGS. 2 and 3A and FIG. 3B

FIG. 2 gives examples of a few typical process sequences e.g. for an additive (deposition) repair process. Examples of additive mask repair procedures. (a) The initial defect is located either by means of an external instrument (e.g. aerial imager) and/or by scanning the probe to obtain a scanning probe microscopy image; (b) Ink is deposited in the defect area under manual or automatic guidance until completion, as shown in (c); if necessary, a post-nanolithography treatment is applied; e.g., to trigger the physical or chemical transformation of the deposit (curing); It might include (d1) heating the wafer; (d2) irradiating it with electromagnetic radiation (e.g., UV light), or (d3) soaking it in an appropriate solution, e.g. a reducing agent in an aqueous or organic solvent, or (d4) exposing it to a chemical vapor (e.g., a reducing agent, a base, or the like), not depicted in FIG. 2. Steps d1 to d3 may be applied to the whole wafer or locally to the vicinity of the pattern. (e) Once the repair is completed, the wafer is optionally cleaned (for example, to remove residual inks) and the repaired defect optionally inspected using atomic force microscopy (AFM) or aerial imaging metrology.

FIG. 3 provides an additional schematic diagram of a possible additive/subtractive photomask-repair apparatus. It is possible to simultaneously or sequentially repair both clear and opaque defects with the same instrument in the same session, if combining DPN™ printing technology with nanomachining and/or DPN™ printing-assisted nanomachining. An array of two active microfabricated cantilevers is brought in close proximity with the photomask wafer (1), for example by monitoring the cantilever deflection during approach. The defect (2) to repair is located e.g. by a combination of actinic optical microscopy and low-force, high-speed SPM imaging of the wafer associated with pattern recognition software. The left probe (3) is supplied with and coated with an ink, while the right one, a high-force-constant cantilever, capable of applying high contact force and/or delivering a second ink can serve as a nanomilling tool. The cantilevers can be individually actuated, e.g. by the thermal expansion of a bimorph formed by a metallic heater on the back of the cantilever and the structural material of the cantilever itself. In the additive repair mode [A], probe 3 is brought in contact with the substrate and rastered at slow speeds to fill the clear defect area. In the subtractive repair mode [B], probe 4 applies a large force to areas where spurious metal has been deposited in order to scrape it. Or probe 4 can remove spurious metal by rastering multiple times the area to scrape it. The probe 4 may be optionally coated with an ink (5) that serves as a lubricant and/or etchant during nanofabrication and nanomachining (hence, it can be a DPN™ printing-assisted nanomachining).

In particular, in one embodiment, the apparatus disclosed in U.S. Pat. No. 6,353,219 to Kley can be adapted to operate in a direct-write nanolithographic printing or deposition mode to make and repair photomasks, particularly, by adding materials, with use of scanning probe microscopic tips coated with one or more inks, as disclosed herein.

IV. Patterning Compounds and Deposit Materials

In addition, a deposit can be the result of one or multiple steps of deposition nanolithography (including but not limited to Dip Pen™ Nanolithographic printing and deposition processes, and related processes), optionally followed or preceded by additional processing steps. It can be, for example, a dot or a line deposited on top of a substrate or any pattern formed by combinations of dots and lines. It can also fill a defect or an engineered recess.

For purposes of the present disclosure, an ink or patterning compound can be one or a plurality of chemical compounds to be delivered in a controlled manner at the nanometer scale. Inks may be fluids, gases, solid matters, or composition thereof. They may be monophasic or multiphasic, homogeneous or heterogeneous in nature, and may include solvents, tensioactive compounds and other adjuvants.

Examples of inks or patterning compounds include:

(1) Small organic molecules, and specifically molecules capable of forming self-assembled monolayers, including thiols, silanes, and metal bisphosphonate derivatives;

(2) Organometallic and inorganic compounds, including metal salts, metal complexes, including these of nickel, chromium, platinum, palladium, copper, gold, silver, iron, molybdenum and tungsten, (3) Reducing or oxidizing agents, including borohydrides (e.g. NaBH4), aluminum and tin compounds, such as lithium tetrahydridoaluminate (lithium aluminum hydride), ethylene diamine, borane complexes (dimethylamine:borane), ethylene glycol, PEG, and on the other hand, and peroxides;

(4) Solution and suspension of nanoparticles, including metallic clusters and polymeric particles, such as gold and silver colloids, latex spheres and derivatives thereof, and $MoSi_2$ powders;

(5) Polymeric compounds; or precursors to polymeric compounds such as, for example, formaldehyde and resorcinol;

(6) Materials of interest in microelectronics processing, including photolithographic resists, strippers, and etchants;

(7) Electroless deposition and electroplating solutions;

(8) Catalysts;

(9) Photographic ink formulations, including silver salt emulsions;

(10) Photosensitizing dyes or plasticizers (ethylcarbazole)

as well as solutions, dispersions and mixtures thereof;

Specifically, the chemical compounds listed below and the mixtures thereof can be used as inks or patterning compounds:

(a) copper formate or acetate, silver sulfate, silver nitrate, silver tetrafluroborate, palladium chloride, acetate, and acetylacetonate, hexachloroplatinic(IV) acid, ammonium iron citrate (b) carboxylates, (pseudo-)halides, sulfates, and nitrates of zinc, nickel, cadmium, titanium, cobalt, lead iron, and tin;

(c) metalcarbonyl complexes, including chromium hexacarbonyl, (d) amine bases, including cyclohexylamine, 3-picoline, (iso)quinoline, cyclopentylamine, dimethylsulfoxide, dimethylformamide, formamide, ethylene diamine (e) polymers, including poly(ethyleneoxide), poly(methylmethacrylate), poly(vinylcarbozol), poly(acrylamide)

Also included are compounds and mixtures thereof, which, after processing, respectively yield optically opaque and optically transparent materials, respectively, at the wavelength of lithography, including the following:

a—metals, such as chromium, palladium, platinum, iron, molybdenum, nickel, silver, and tungsten; or b—materials primarily composed of silica, silicates, alumina, molybdenum silicide, as well as sol-gel precursors, orthosilicates/borates/aluminates and/or metal oxides, such as $In_2O_3$ and $SnO_2$, MoSi (e.g. spin-on glasses, ITO);

Deposition steps include but are not limited to the deposition of one or more inks e.g. by DPN™ printing or deposition with one or more probe(s). Possible inks include but are not limited to precursors, compounds that will form the bulk of the final pattern, catalysts, solvents, small molecule or polymeric carrier agents, host matrix materials, or sacrificial reducing agents, and mixtures of above materials. They may be deposited as thin films or as thick multilayers (formed by multiple deposition steps), with or without variation of the chemical composition from layer to layer.

Figure 26:
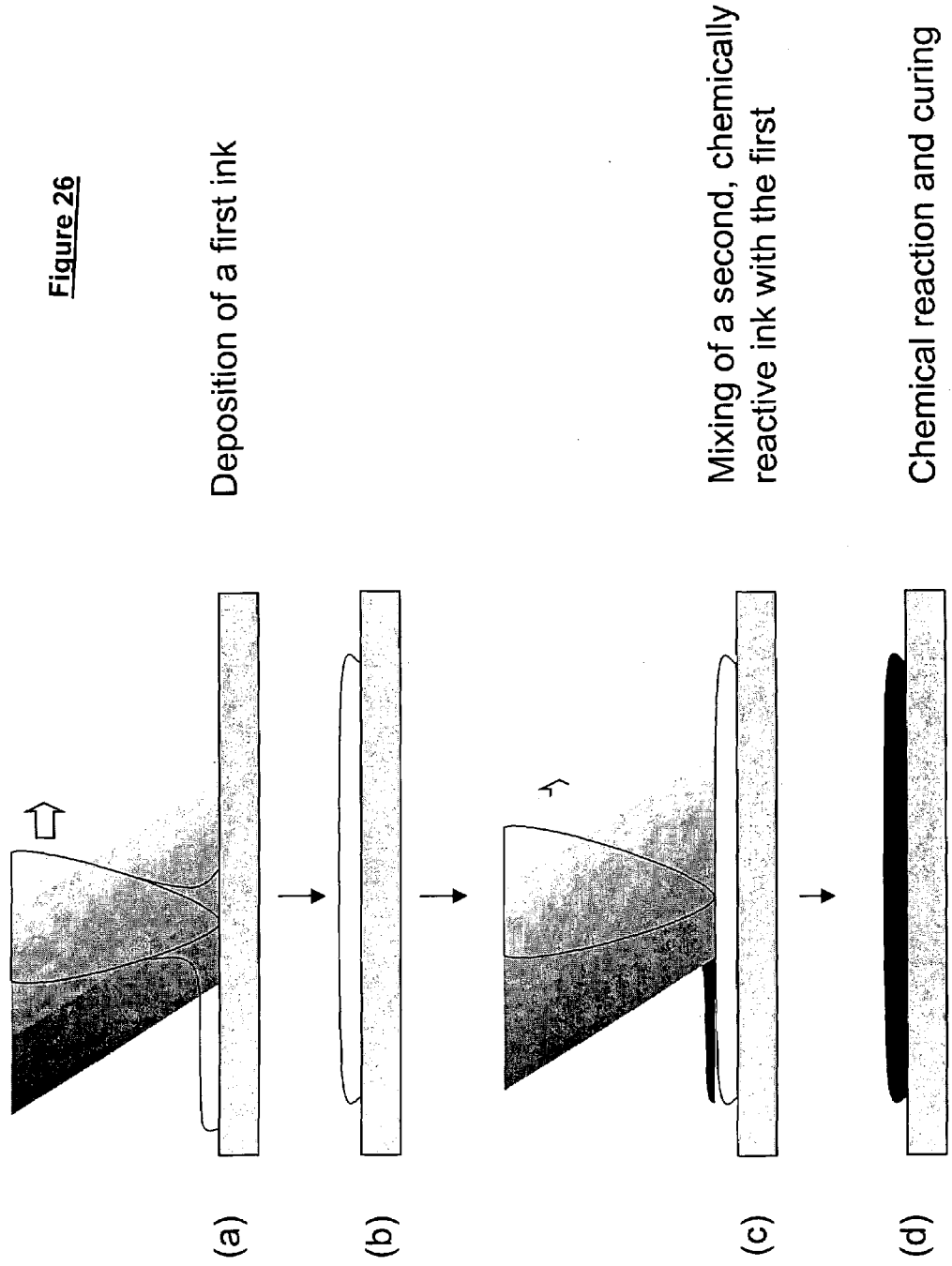
FIG. 26 illustrates an embodiment with two chemically reactive inks.
Figure 27:
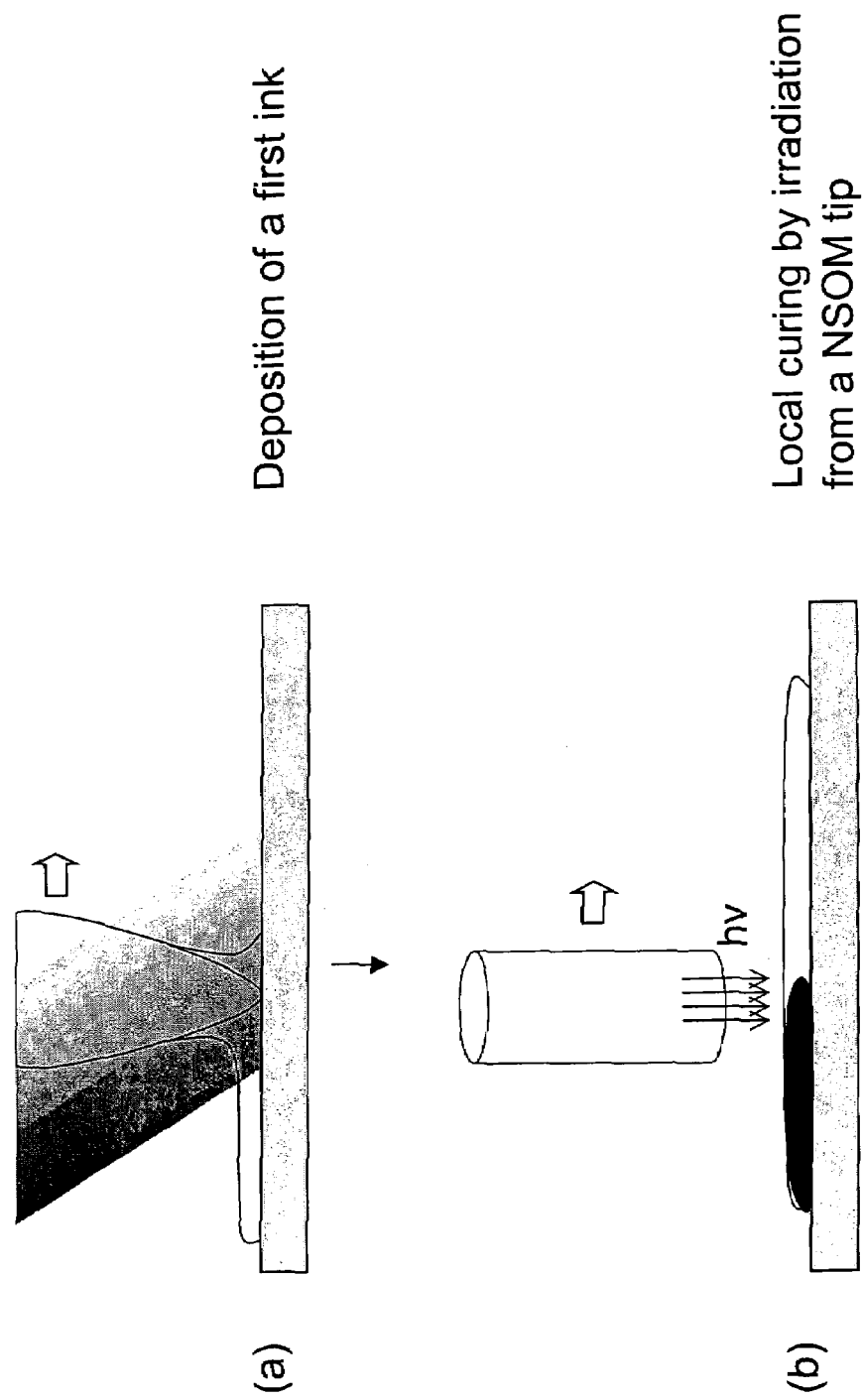
FIG. 27 illustrates local curing by irradiation from an NSOM tip.

Additional embodiments are shown in FIGS. 26 and 27. FIG. 26 shows use of a plurality of inks which react with each other. FIG. 27 shows use of external radiation to induce local cure of the ink. Additional embodiments are described in the figures and examples.

V. Pre-Deposition and Post-Deposition Steps

In principal, deposition and etching methods considered in this invention also consist essentially of (a) zero or more pre-deposition steps, including zero or more defect characterization steps;
(b) zero or more probe/substrate cleaning or chemical modification steps aimed at improving ink coating;
(c) one or more deposition steps, which may use dip pen nanolithography technology;
(d) zero or more post-deposition steps, including zero or more cleaning steps;
(e) zero or more inspection steps;

Pre-deposition substrate surface treatment steps include but are not limited to (in no particular order):

(a) plasma, UV, or ozone cleaning, washing, drying, blow-drying,
(b) chemical cleaning, such as piranha cleaning, basic etching (e.g. hydrogen peroxide and ammonium hydroxide)
(c) chemical or physical modification of the substrate to promote ink transport, or adhesion, or covalent modification (e.g., base treatment to impart a charged surface on silicon oxide, silanization with amino- or mercapto-silanizing agents, polymers carrying chemically reactive functional groups)
(d) protection against side-effects of following process steps (e.g. coating with a resist or thin film),
(e) inspection of the substrate with techniques derived from optical microscopy (e.g. AIMS), electron microscopy (e.g. CD SEM) or imaging (e.g. EDS, AES, XPS), ion imaging (e.g. TOF SSIMS) or scanning probe imaging (e.g. AFM, AC AFM, NSOM, EFM . . . ),
(f) any of the steps detailed below in the post-deposition section, and combination thereof, Probe cleaning or modification steps include but are not limited to (in no particular order):

(a) plasma cleaning, washing, drying, blow-drying,
(b) chemical cleaning, such as piranha cleaning, basic etching (eg. hydrogen peroxide and ammonium hydroxide), and sodium hydroxide;
(c) chemical or physical modification of the probe to promote or enhance ink coating, adhesion, or transport (eg. base treatment to impart a charged surface of the silicon nitride tip, silanization with amino- or mercapto-silanizing agents, non-covalent modification with small molecule or polymeric agents such as poly(ethyleneglycol)) Such modifications include those that increase loading of the ink on the tip by increasing porosity or enhancing surface area available for ink delivery.

Post-deposition steps include but are not limited to (in no particular order):

(a) Heating of the substrate, for example with a heat lamp, hot air blower, or hot plate, or furnace;
(b) Irradiation of the substrate with electromagnetic radiation (esp. IR, visible, and UV light) or charged particles (e.g. electrons, ions drawn from a gun or a plasma source). This process may occur in air, vacuum, or in solution, with or without photosensitizing agents,
(c) Immersion of the patterned substrate in one or more solutions,
(d) Electrochemical reduction,
(e) Chemical reduction,
(f) Exposure of the patterned substrate to a vapor or gas,
(g) Sonication of the patterned substrate, as well as all nanoscale, local equivalents of the steps outlined above, if applicable, the source of the energy and/or composition of matter been provided by one or more probe(s), which may or may not be the same than the DPN probe(s); which include but is not limited to:
(h) Local heating of the deposited matter or surrounding substrate,
(i) Local irradiation of the deposited matter or surrounding substrate, and all combinations thereof.

The succession of all or some steps may be repeated several times.

A series of additional embodiments, including some working examples, are described further below.

Part 1

Direct Deposition

In a first embodiment of the invention, one or more ink(s) is (are) deposited in the area with e.g. Dip Pen™ Nanolithographic printing or deposition. Ink with different chemical compositions may be deposited in succession. For example, a priming ink may be deposited first to afford appropriate surface chemistry. A second ink is then deposited one or multiple times by multiple repetition of the deposition step, layer by layer, until a sufficient thickness is achieved.

Figure 6:
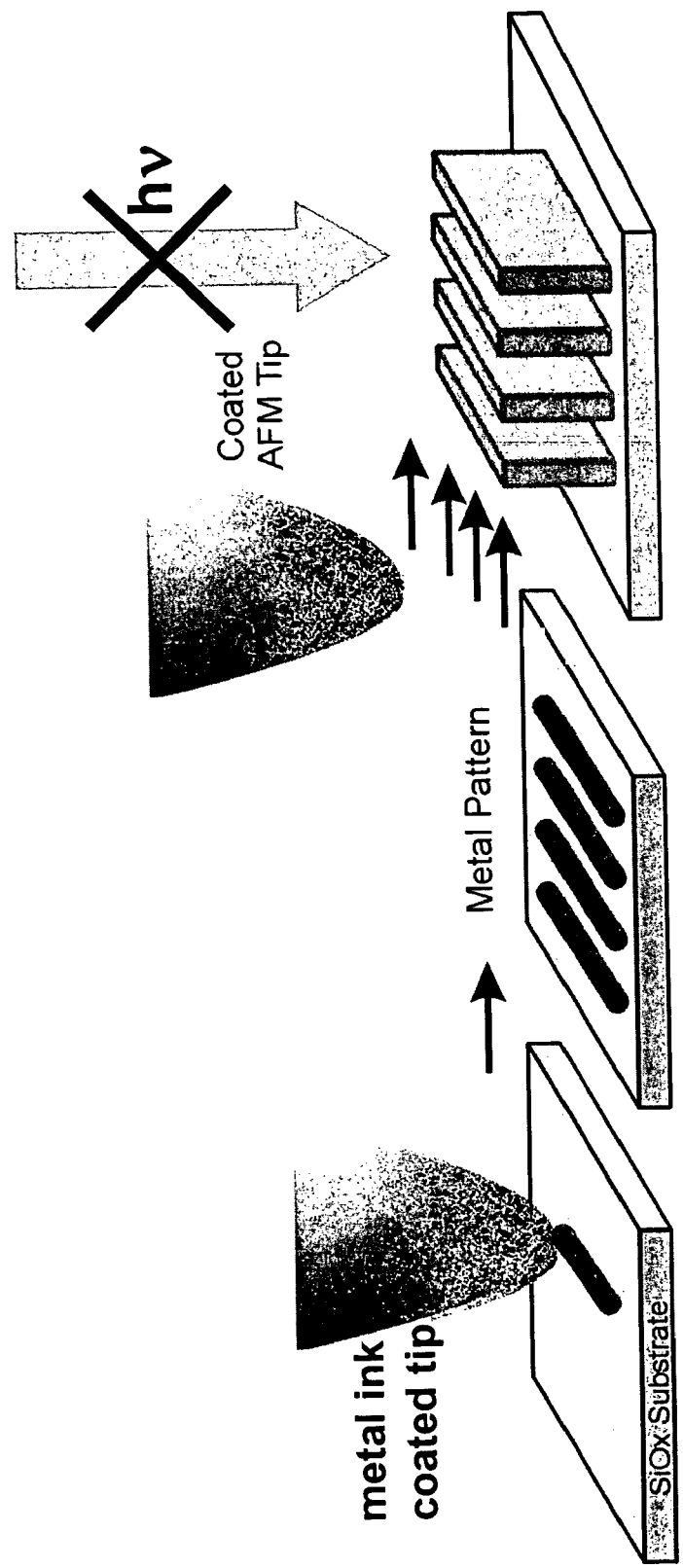
FIG. 6 illustrates metal patterning.

FIG. 6 illustrates stepwise deposition of metal precursor inks in the form of nanometer thick layers. Each layer may or may not be treated with chemical reducing agents or radiation prior to application of subsequent layers. An appropriate number of layers are deposited to form optically opaque structures of metal, metal oxide, or other opaque materials.

FIG. 26 represents another embodiment.

Example 1

A polymer or polymer precursor is deposited and air-dried or air-cured. To obtain optically adequate (i.e. opaque) deposits, the curable polymer/precursor may be mixed with a colloidal solution, esp. metallic or metal oxide nanoparticles. Commercially available inks include water-, methylisobutyl ketone or isopropanol-based silver and carbon nanoparticle paints, such as these commercialized by Ted Pella, Inc.

Example 2

A priming layer, such as ω-functionalized self-assembled monolayer (e.g. trialkoxy- or trichlorosilanes on quartz, alkanethiols on coinage metals) is deposited on the substrate. The ω-terminal functional group (e.g. —SH, —COOH, —CHO . . . ) is selected as a function of the subsequent inks to deposit. For example, ligand-protected metallic colloids (gold, silver) may adhere by place-exchange between the ligand and the layer terminal group, and by electrostatic interaction. In another example, a (e.g., amine-rich or carboxylic acid-rich) polyelectrolyte is deposited that has an opposite charge to that of the ω-terminal group. Charged colloidal particles may then be deposited to form an electrostatic sandwich, as described by Chen et al [K. M. Chen, X. Jiang, L. C. Kimerling and P. T. Hammond, "Selective Self Organization of Colloids on Patterned Polyelectrolyte Templates", *Langmuir*, 16, 7825-7834 (2000).] and by Wuelfing et al (Chem. Mater. 2001, 13, 87-95)

Part 2

Deposition and Application of a Chemical Compound or Mixture

In a second embodiment of the invention, deposition is preceded or followed by application of one or more compound(s) or mixture(s) to the whole substrate. In a preferred embodiment, the substrate is immersed in one or more bath(s) after deposition of one or more ink(s) e.g. by DPN™ printing or deposition. The process may be repeated multiple times. For example, the precursor may be a (noble metal) catalyst and the bath an electroless deposition solution, or the precursor may be a metallic salt and the bath a reducing agent.

Example 3

Metal Deposition and Chemical Reduction

Palladium chloride ($PdCl_2$) or acetate was deposited from an aqueous solution by DPN™ printing or deposition in the area to fill with metal. The palladium salt structures were reduced to the metallic state, $Pd^0$, by deposition of a reducing agent (e.g. stannous chloride ($SnCl_2$), aqueous dimethylamine-borane, dimethylsulfide:borane, or sodium borohydride) by DPN™ printing or deposition, or flooding, or immersion of the substrate in a bath containing a solution of the reducing agent. This procedure may also be used to deposit other metals, such as silver, copper, iron, platinum, gold, and cobalt when the appropriate metal salt is chosen as an ink.

Figure 10:
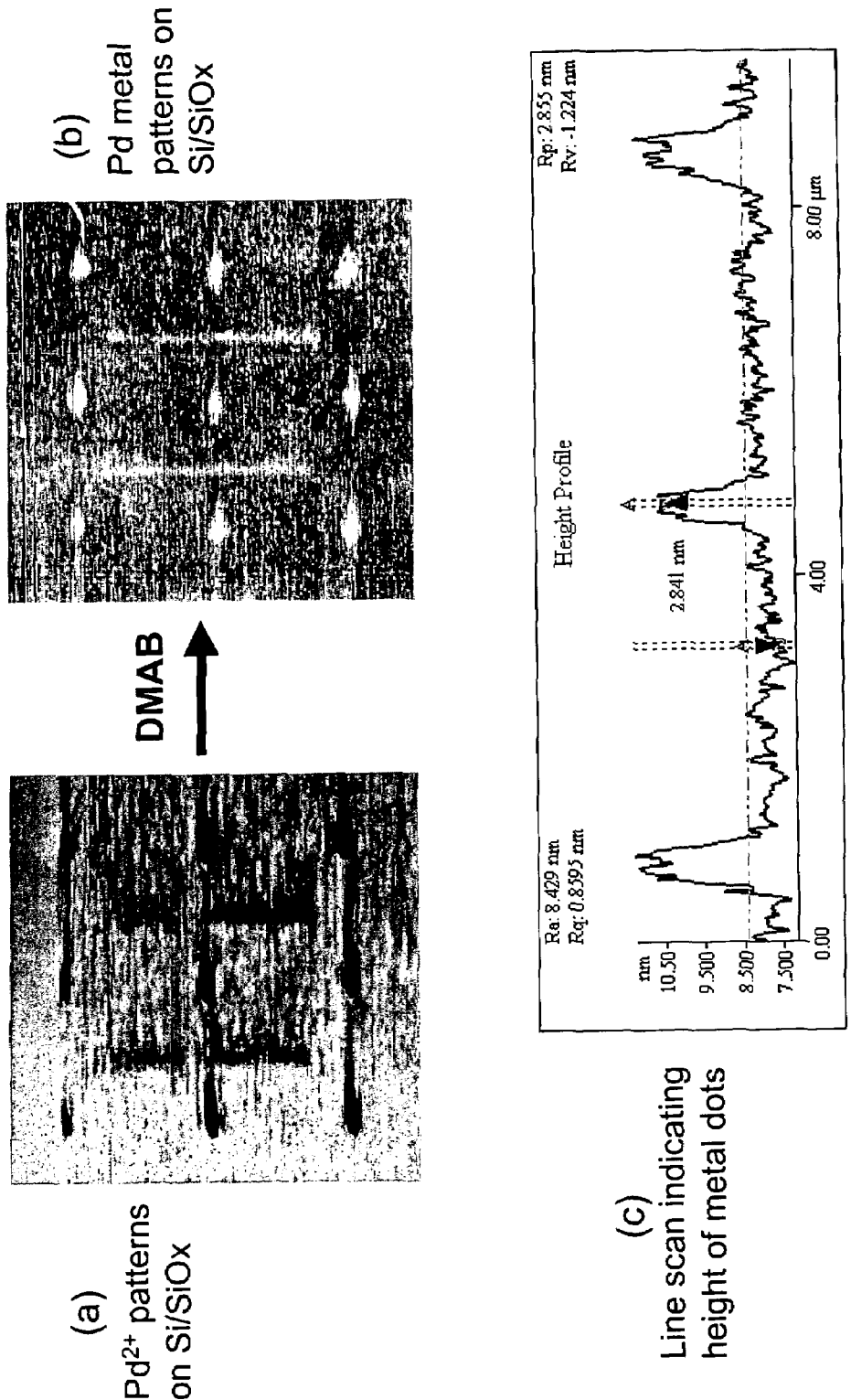
FIG. 10 shows palladium patterning.

FIG. 10. (Working Example) AFM images before and after the reduction reaction are shown in FIG. 10. Deposition of disodium palladium chloride (1 mg/μL in water) with 10% polyethyleneoxide (MW 10,000) via DPN™ printing on amino-silanized glass (Schott Glass company), and subsequent chemical reduction to palladium metal using 0.03 M aqueous solution of dimethylamine:borane complex (DMAB). Atomic force micrographs of pattern showed (a) pallidium salt pattern before reduction, (b) metal line and dot pattern after reduction by DMAB, and (c) a line scan indicating the height of the dot patterns.

Example 4

Metal Deposition Using Electroless Deposition

Sodium tetrachloropalladate II (Palladium chloride, NaPdCl₄) or acetate is deposited from an aqueous solution by DPN in the area to fill with metal. The palladium is reduced to the catalytic state, $Pd^0$, by deposition of a reducing agent (e.g. stannous chloride ($SnCl_2$), dimethylamine-borane or sodium borohydride) by DPN™ printing or other deposition method or immersion in a bath. The palladium features are then put in contact with an electroless deposition bath, including the following examples:

(1) nickel sulfate, sodium hypophosphite, lactic acid, sodium hydroxide, thiourea (nickel deposit);
(2) nickel sulfate, sodium hypophosphite and chloride, sodium succinate, hydrochloric acid (nickel deposit);
(3) cobalt chloride, sodium citrate, ammonium chloride (cobalt deposit);
(4) copper sulfate, sodium hydroxide, formic acid, EDTA, methyldichlorosilane (copper deposit);
(5) potassium gold cyanide, potassium cyanide and hydroxide, potassium borohydride (gold deposit);
(6) palladium chloride, hydrochloric acid, ammonium hydroxide and chloride, sodium phosphate monobasic (palladium deposit);
(7) silver and sodium cyanide, sodium cyanide and hydroxide, dimethylamine-borane (silver deposit);
(8) stannic chloride ($SnCl_4$), chromium(III) oxide ($Cr_2O_3$) and $NH_4F_2$ (chromium deposit).

See also "electroless rhodium plating" [Kozlov et al., U.S. Pat. No. 6,455,175, 2002], which is hereby incorporated by reference. A composite film may be deposited, using an electroless deposition solution containing colloidal particles. Platinum salts have also been used in this procedure to form platinum metal structures which catalyze metallic cobalt deposition. Immersion deposition, which uses the substrate or a sacrificial layer on the substrate as the oxidized species, is also an option.

Example 5

A polymer catalyst is deposited on the substrate and put in presence of a precursor solution (monomer). The reaction of a gas or liquid at the catalyst forms surface-bound polymer brushes, which can then be pyrolyzed or metalized via electroless deposition. Generally, methods are desired for depositing polymers and then pyrolyzing them into a chemically resistant and opaque carbon-rich residue.

Part 3

Deposition-Irradiation

In a third embodiment of the invention, one or more ink(s) is (are) applied to the substrate in the form of a pattern, and the ink(s) are transformed into a desired material (eg. metals or oxides) by action of external heating, light irradiation, or sonic excitation (see for example FIG. 27).

Example 6

Oxidizing and reducing compounds were mixed together, applied to the tip and deposited on the substrate at selected locations by DPN™ printing or deposition. The ink mixture was then heated (either by heating of the whole substrate or by local probe-induced heating). Specifically, a metal salt and organic ligand cocktail can be used. A typical ink formulation consisted of a metal salt (e.g. carboxylate, nitrate, or halide) along with an appropriate organic Lewis base or ligand (amines, phosphines). Additives (small molecules such as ethyleneglycol, polymers such as polyethyleneoxide, PMMA, polyvinylcarbazol, etc) may also be used that modify the solubility, reactivity, or Theological properties of the ink. After deposition of the ink mixture, gentle heating in an ambient or inert environment (40-200° C.) assisted the disproportionation of the salt to form a metallic precipitate and a volatile organic. This approach enabled deposition of a variety of metals or metal oxides, for example copper, under mild conditions with very little organic contaminant [See Sharma et al., U.S. Pat. No. 5,980,998, the complete disclosure of which is hereby incorporated by reference, in particular for the materials deposited]. Potential pitfalls may occur if the ligand evaporates from the patterned substrate before reaction takes place. In that case, the salt-patterned substrate may be exposed to a ligand in a second step prior to the heating.

One specific example of the use of this method used DPN™ printing or deposition to pattern palladium acetylacetonate dissolved in chloroform on oxidized silicon, glass, or amino-silanized glass. After patterning, a droplet (1 microliter) of formamide was placed on the horizontal substrate and heated to 150° C. for 2 min. the resulting metal patterns were stable towards solvent rinsing (including water, alcohols, and other non-polar organics) while the salt patterns prior to reduction were removed by solvent rinsing.

Figure 11:
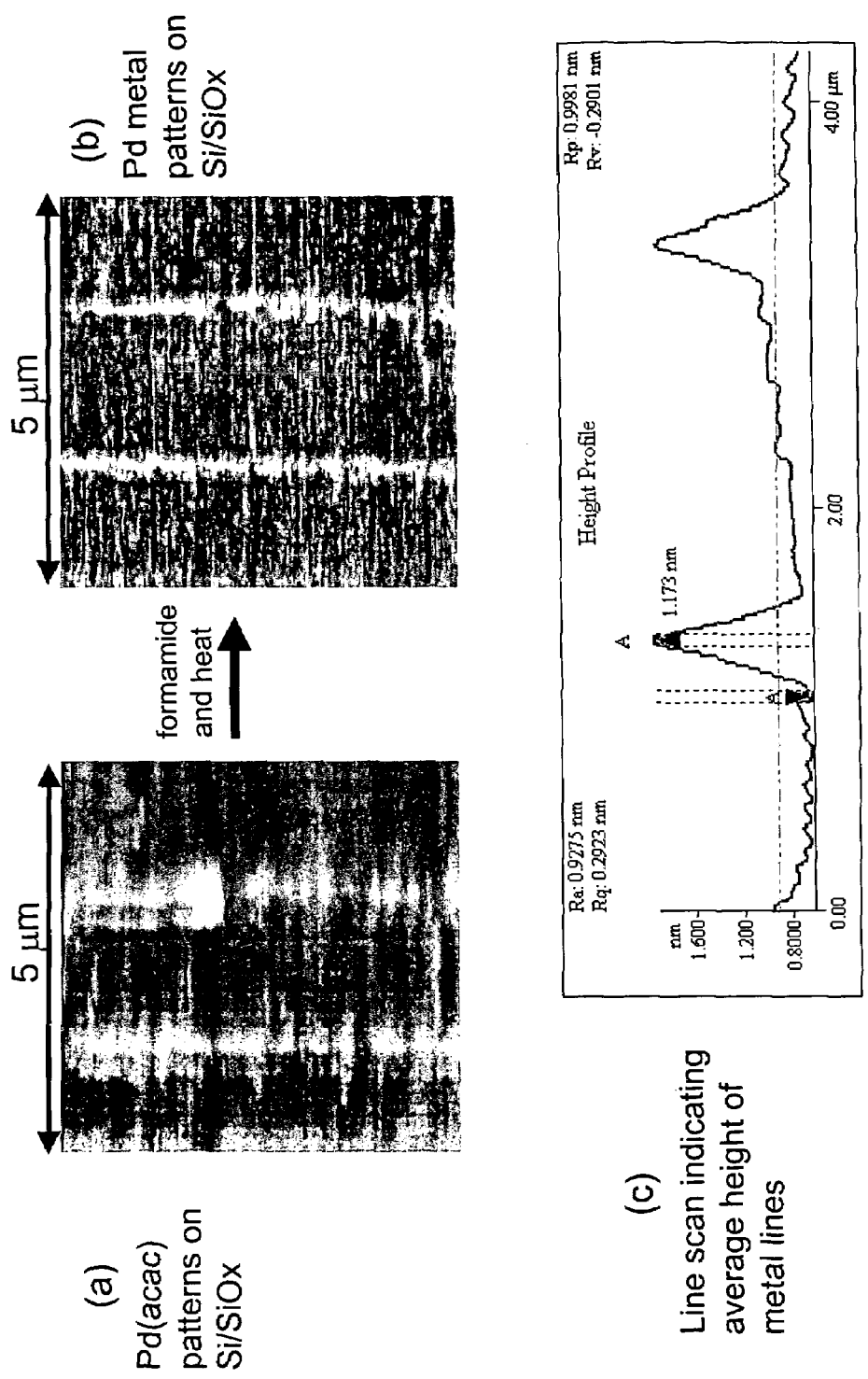
FIG. 11 shows palladium patterning.

FIG. 11. (Working Example) FIG. 11 shows AFM images and a height scan of the patterns before and after treatment with formamide and heat. Deposition of palladium acetylacetonate [Pd(acac), 1 μg/mL in $CHCl_3$ and DMSO] via DPN™ printing on an oxidized silicon substrate, and subsequent reduction by application of formamide and heat (heating 85° C.-120° C.) to the patterned surface. Atomic force micrographs showed (a) a palladium salt pattern before reduction, (b) the corresponding metal line pattern after heat, and (c) a line scan indicating the height of the dot patterns.

Example 7

Chromium hexacarbonyl is applied to the tip used for DPN™ printing or deposition and patterned on the photomask. The mask is then heated above its decomposition temperature (>150° C.), freeing gaseous carbon monoxide and depositing metallic chromium. The process may also be used with tungsten and molybdenum hexacarbonyls. A similar process would use the thermal, spark plasma or optically assisted decomposition of $WF_6$ or $WCl_6$, which are commercially available chemical vapor deposition (CVD) agents.

Example 8

An alloy of a liquid metal (i.e. gallium, indium or mercury) is formed with a soluble metal to deposit, e.g. copper, silver or gold for Hg. Ternary or quaternary alloys may also be formed e.g. by adding bismuth, cadmium or zinc. The alloy, which may be liquid or paste at or near room temperature, is applied to the tip by appropriate means and deposited in areas to be filled. The alloy is then decomposed by heating (e.g. mercury is volatilized) or by chemical oxidation, leaving behind a metal or a simpler alloy with much higher melting point.

Example 9

A thermoset polymer is deposited by DPN™ printing or deposition and the substrate heated until curing.

Example 10

Related to Example 9, a carbon-rich polymer or its precursor is deposited via DPN™ deposition or printing. The polymer is then calcinated to afford a graphite-like material. Examples of useful polymers include polyacrylonitrile (PAN). Non-itumescent polymers are preferred. The precursor/polymer may be dissolved in a solvent, deposited on the DPN™ deposition or printing probe, and transferred to the opening to fill. The substrate is then heated until carbonization of the compound.

Figure 9:
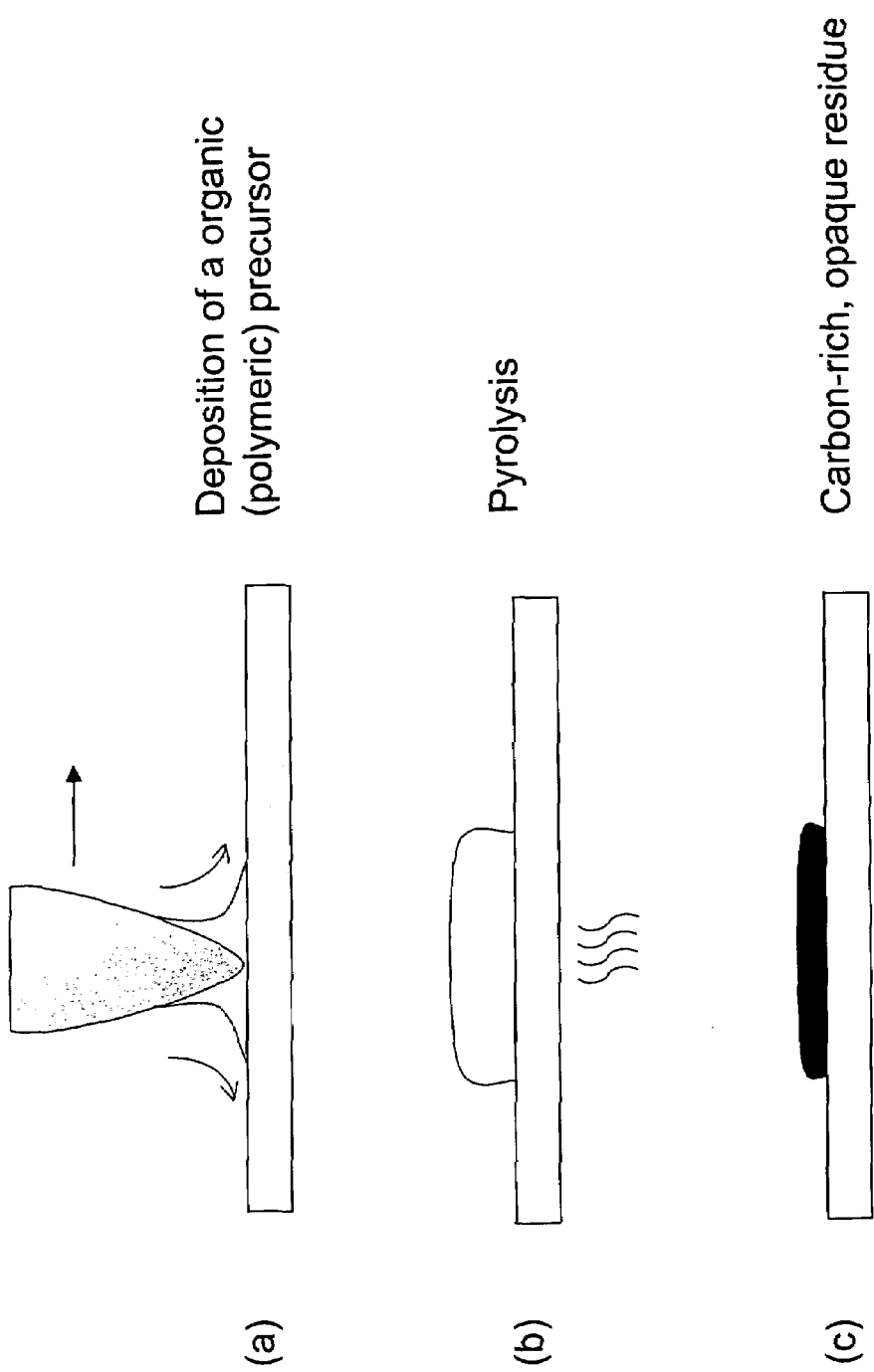
FIG. 9 illustrates polymeric precursor patterning.

FIG. 9 illustrates deposition of an organic polymeric solution, followed by calcination into a carbon-rich material; Pyrolysis of a metalorganic precursor into a metal-rich compound is also feasible.

Example 11a

Figure 12:
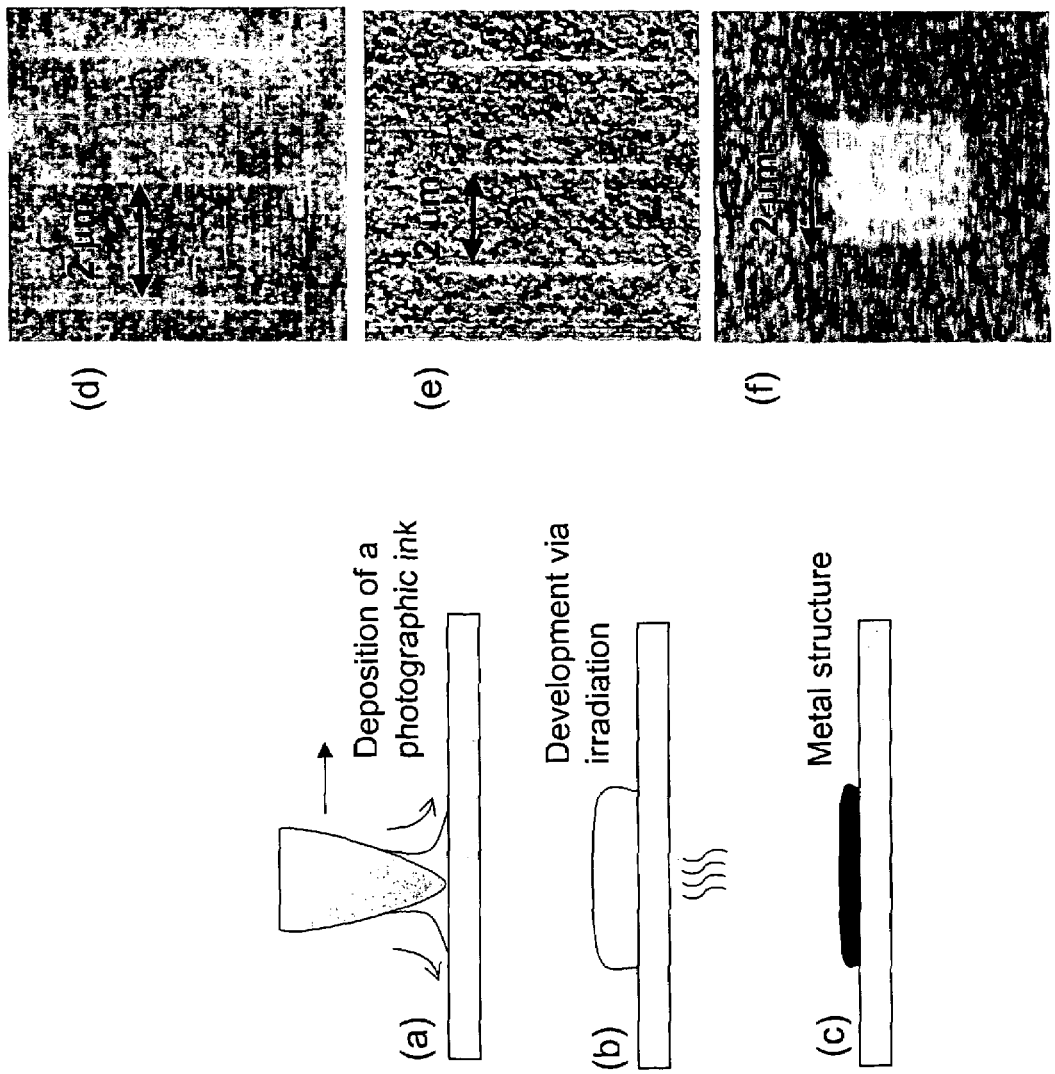
FIG. 12 shows metal patterning.

FIG. 12 (working example). A photosensitive ink mixture, such as a photographic emulsion was applied to the opening to be filled and the substrate was irradiated with light in order to cure it. Examples included the silver salt emulsion used in the VanDyke process (ferric ammonium citrate 90 g, tartaric acid 15 g, silver nitrate 37.5 g, and deionized water 1000 g) or other metal salts that become light sensitive when placed in the presence of an organic substance. The emulsion was prepared by (1) mixing ferric citrate and tartric acid; (2) adding silver nitrate in small portion while stirring, (3) adding additional water and (4) aging the solution for 2-3 days. This mixture was then used as an ink in the DPN™ printing or deposition process, dried, and then cured under a UV lamp to form a metallic material. FIGS. 12a-c illustrates this method. FIG. 12d is an AFM image of the pattern generated on amino-silanized glass when the silver nitrate emulsion was used as an ink. FIGS. 12e,f are images of the patterns (lines and square) that were generated when silver sulfate was substituted for silver nitrate in the photographic ink mixture. FIG. 12. (a) Deposition of a silver salt emulsion comprising ferric ammonium chloride, tartaric acid, silver nitrate or sulfate, and water onto an amino-silanized glass substrate via DPN™ printing, followed by (b) development by photoreduction under a UV lamp to form (c) metal nanostructures. See, for example, 300 year old Van Dyke photographic process. AFM images showed patterns fabricated with silver nitrate (d) and sulfate (e,f) as the metallic salt.

Example 11b

A photosensitive polymer precursor is applied to the opening to be filled and the substrate is irradiated with light in order to cure it. Examples include commercial UV-curable epoxy glues sold e.g. by Epotex and commercial UV-crosslinked resists (commercialized for example by Shipley or Clariant).

Example 12

In this embodiment of the invention, a sharp light-guiding probe is used as the ink deposition means or in conjunction with an ink deposition means. Once the ink is deposited on the surface, the chemical or physical state of the ink can then be altered by local irradiation from a (coherent) light source to afford the desired product (see FIG. 27 and additional description below regarding in-situ curing).

The light-guiding probe may be a pulled optical fiber or hollow micropipette, which has been optionally coated with an opaque material (e.g. aluminum), a scanning near-field optical microscopy probe, or a sharp metallic or metal-coated (apertureless NSOM) probe placed in the focus of a laser beam, which is capable of a highly localized amplification of the electromagnetic field between the probe and surface. The ink can be, for example, a UV-curable polymer or a UV-curable polymer-based mixture.

Example 13

An ink mixture is applied to a surface in the form of a nanoscale pattern. Exposure to radiation at appropriate power and frequency, for instance from a laser, induces formation of a continuous metal film. An example of such an ink mixture was described by Stellacci et al (Adv. Mater, 2002, 14, 194), which is hereby incorporated by reference in its entirety. This metal ink formulation consists of a metal salt (such as silver tetrafluoroborate), metal seed particles, photosensitizers, and a host matrix polymer (such as polyvinylcarbazole) that acts as a sacrificial reducing agent. After deposition onto a surface this metal ink formulation can be reduced to solid metal features by laser pyrolysis. This approach enables deposition of metals such as silver using relatively low continuous wave laser exposure levels (1 mW). This approach is also useful for patterning other metals such as gold and copper with appropriate choice of metal salts and polymer host. The process is improved by the addition to the ink mixture of plasticizers such as ethylcarbazole.

Example 14

A suspension of nanometer sized metal nanoparticles is directly deposited in the form of the nanoscale structure or film on a substrate and then irradiated to generate continuous metallic structures. One example would use thiol-protected gold nanoparticles such as those described by Ali et al (Langmuir 2002, 18, 872-876), or palladium particles such as those described by Hidber et al (Langmuir 1996, 12, 1375-1380), both of which are hereby incorporated by reference.

Example 15

A low-melting-temperature thermoplastic polymer is applied to a heated probe and deposited while hot and fluid. Cooling of the polymer on the cold substrate affords the final feature. The polymer may be loaded with a thermostable filler.

Part 4

Colloid Deprotection and Fusion

Example 16

In another embodiment of the invention, a solution of encapsulated nanoparticles is deposited in the area to pattern. Encapsulation may be provided by a (a) a small organic ligand bound to the particle (e.g. pyridine on copper nanoparticles); (b) a monolayer self-assembled on the nanoparticles (e.g. alkanethiols on gold nanoparticles; see Wuelfing et al., *Chemistry of Materials*, 13(1): 87-95, 2001); (c) a polymer adsorbed by Van de Waals or electrostatic forces (e.g. PEG). The nanoparticles are deprotected and fused together by heating to form opaque metallic structures.

Because the sintering temperature is much lower than the bulk melting temperature, due to the Kelvin effect observed with small diameter clusters ["Sintering of alkanethiol-capped gold and platinum nanoclusters", J. E. Martin et al. J Phys. Chem. B 107(2):430-434, 2003], such technology is practical even for temperature-sensitive photomasks.

Micrometer-scale equivalents of this patterning technique can be carried out: See for example "Microstructuring by printing and laser curing of nanoparticle solutions", Bieri et al., Applied Physics Letters 82(20); 3529-3531, 2003 and "laser writing in polarized silver nanorod films" O. Wilson et al., Advanced Materials 14(13-14):1000, July 2002.

Figure 7:
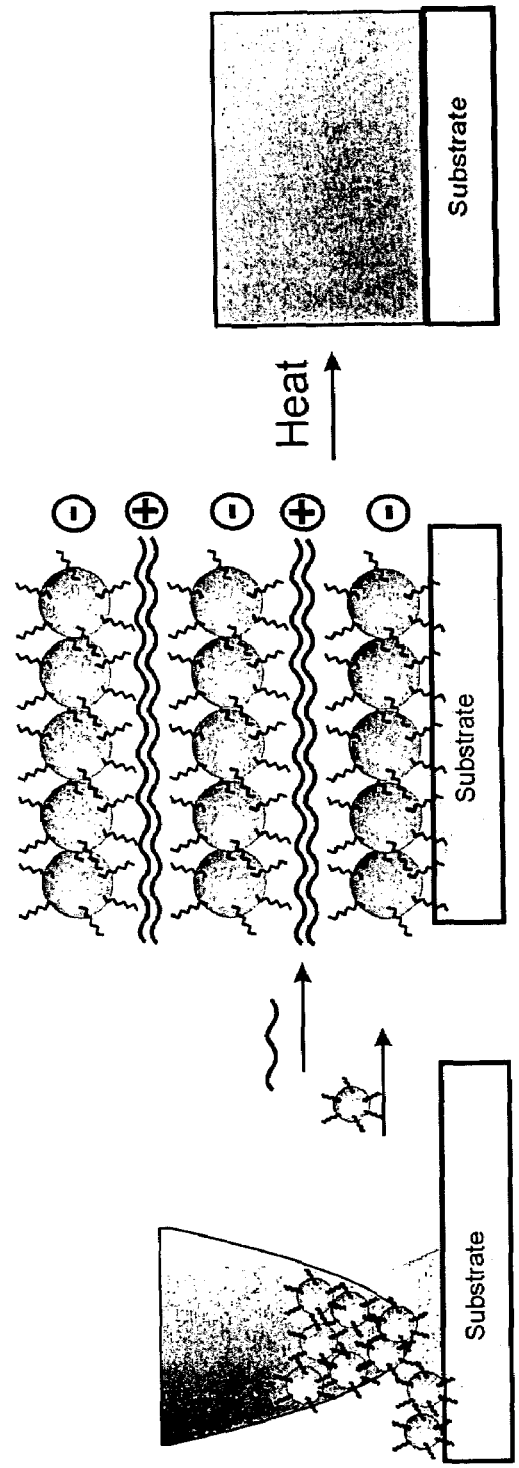
FIG. 7 illustrates particulate patterning.

An alternative to direct deposition of ligand-stabilized metallic nanoparticulate inks is the deposition of nanoparticle beds in a layer-by-layer fashion, with the aid of oppositely-charged metal ions or polyelectrolytes. See FIG. 7, which shows nanometer-scale deposition of metal structures by deposition of ligand-stabilized metallic or metal oxide nanoparticles, followed by thermolysis-induced ligand deprotection and particle fusion. The nanoparticles are optionally deposited in a controlled, layer-by-layer fashion by successive layering with an adhesive layer (oppositely-charged metal ions or polyelectrolytes).

Figure 8:
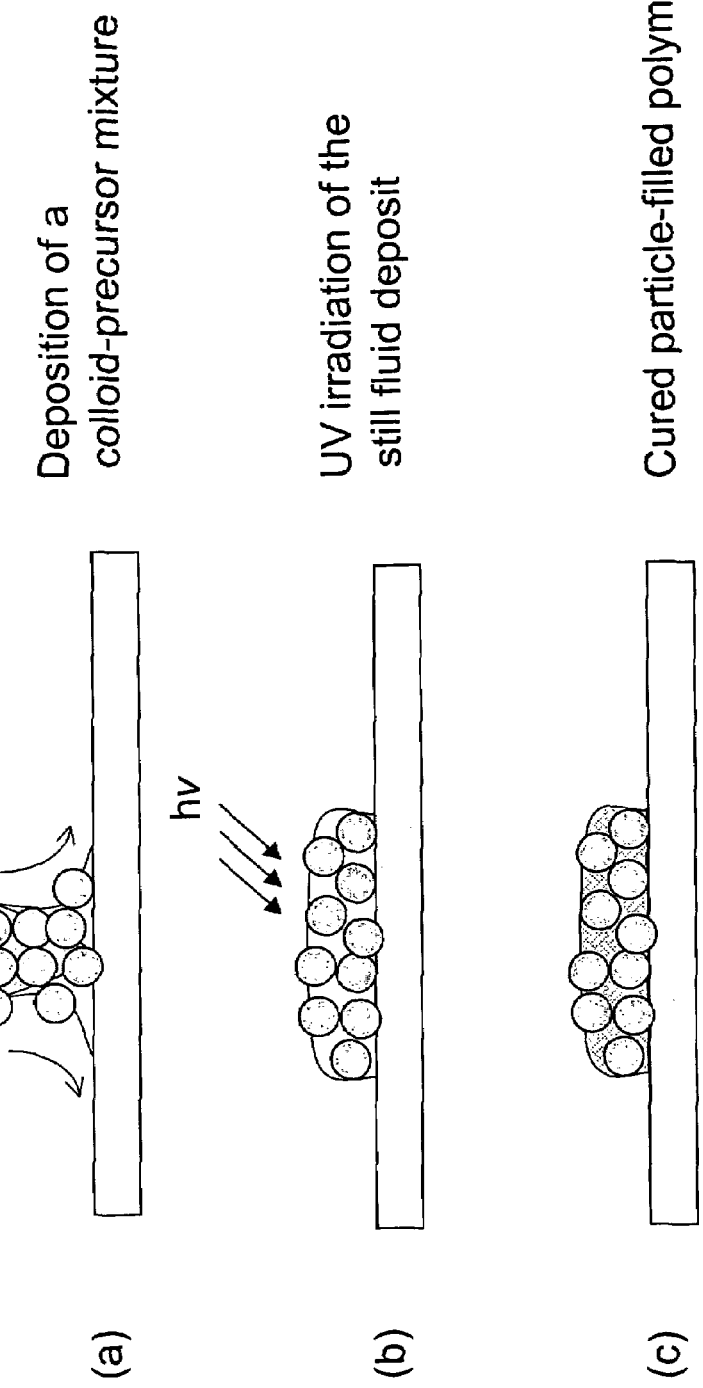
FIG. 8 illustrates colloidal patterning.

FIG. 8 illustrates deposition of a mixture of a (polymeric) precursor and metal colloids, followed by UV curing. This method may use commercial preparations (silver paints). Air-curable or thermoset polymers, sol-gels, and oxide nanoparticles may also be used.

In addition, copper nanoparticles protected by nitrogen-containing aromatic compounds can be deposited and then heated to >300° C. [Winter 2001].

Part 5

Direct Electrodeposition

In another embodiment, a bias is applied between the deposition nanolithography probe coated with a redox compound and the substrate, which must be conductive or rendered so e.g. by previous application of a conductive film (such as indium tin oxide, ITO).

Example 17

Figure 4:
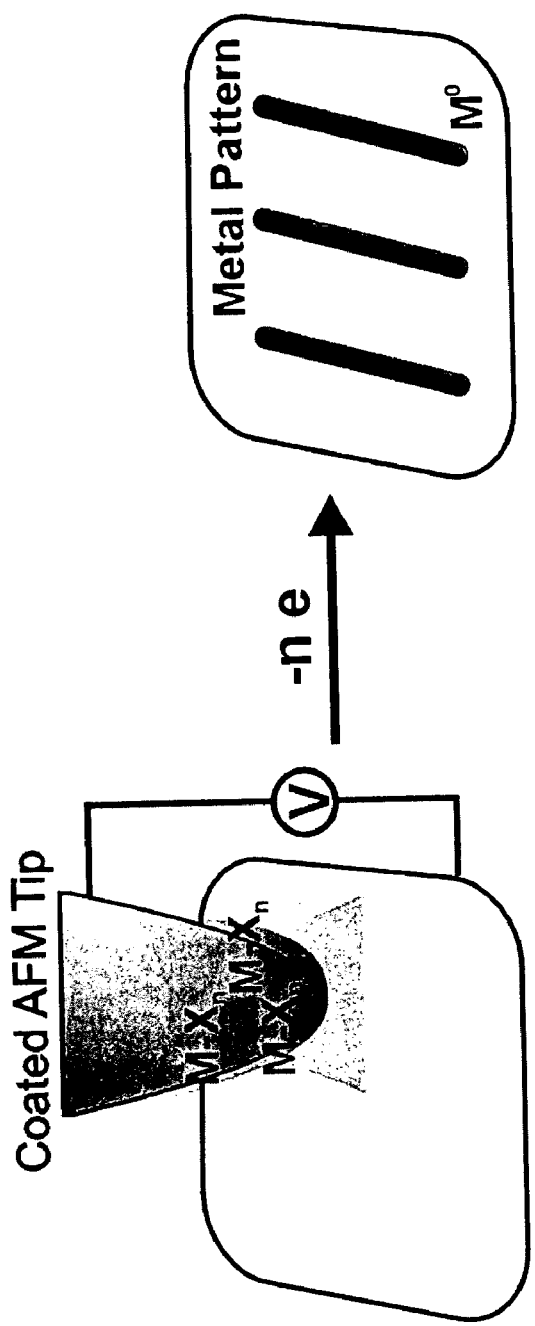
FIG. 4 illustrates metal patterning.

A metal is deposited from the corresponding salt under electrochemical bias. Li et al. described a method of depositing metal nanostructures via DPN wherein a metal salt such as $HAuCl_4$ is delivered to and reduced simultaneously at the substrate surface via a nanoscale electrochemical reaction [Li, 2001]. See FIG. 4. FIG. 4 illustrates metal deposition via DPN™ printing under bias control. A voltage bias is applied between a conductive probe, for example a metal-coated atomic force microscopy (AFM) tip, and the substrate, which must be rendered conductive. The probe has been coated beforehand with a redox-active ink, for example a metal-ligand complex. Without wishing to be bound by theory, it is believed that the meniscus that can naturally form between the probe and substrate may in some cases serve as a nanometer-scale, mobile electrochemical cell, in the manner of scanning electrochemical microscope probes [Bard 1999]. The bias-applying power supply may be a voltage source, a current source, and may be regulated as a function of the probe speed and the gap resistance.

A similar method may be used to fill defect voids in chrome structures with metals such as copper, gold, and platinum. Multiple passes over the defect region will be performed to build up the metal to desired height in a highly controlled manner. This method can be appropriate for repair of voids in chromium features due to the conductive nature of material surrounding the defect site. In this case, it may be possible to use a second, proximal probe tip to supply bias.

Part 6

Deposition of Optically Transparent and Opaque Materials

In this part of the invention, the additive repair of optically transparent substrates, such as quartz or sapphire, is disclosed. The objective is to improve the transmissibility of and to correct for phase shift errors of a transparent substrate that (a) presents a void; or (b) presented a bump but has been overrepaired.

As in opaque material repair methods, the void is either filled directly with the material or filled with a precursor which is then processed to afford the desired material.

Materials to be considered as fillers should have an optical transmissibility and an index of refraction at the lithography wavelength and a thermal expansion coefficient close to these of the substrate. Preferably, the material being deposited has the same or generally the same chemical composition as its substrate.

Example 18

Spin-on-Glass

Spin-on glasses (SOG) are liquid formulations forming a glassy substance after baking. Common formulations include, for example, silicates, phosphosilicates or siloxanes doped with arsenic, antimony, boron or phosphorous compounds, as precursor to silica- or silicate-rich materials. Commercial precursor solutions are provided e.g. by Honeywell Electronic materials.

Example 19

Sol-Gels

In another example, a sol-gel precursor is patterned and converted into an opaque oxide or metal. Su et al described deposition of solid state structures using sol-gel metal alkoxide precursor inks via DPN™ printing or deposition [Su et al., *J. Am. Chem. Soc.,* 124(8), 1560-1561, February 2002].

Figure 5:
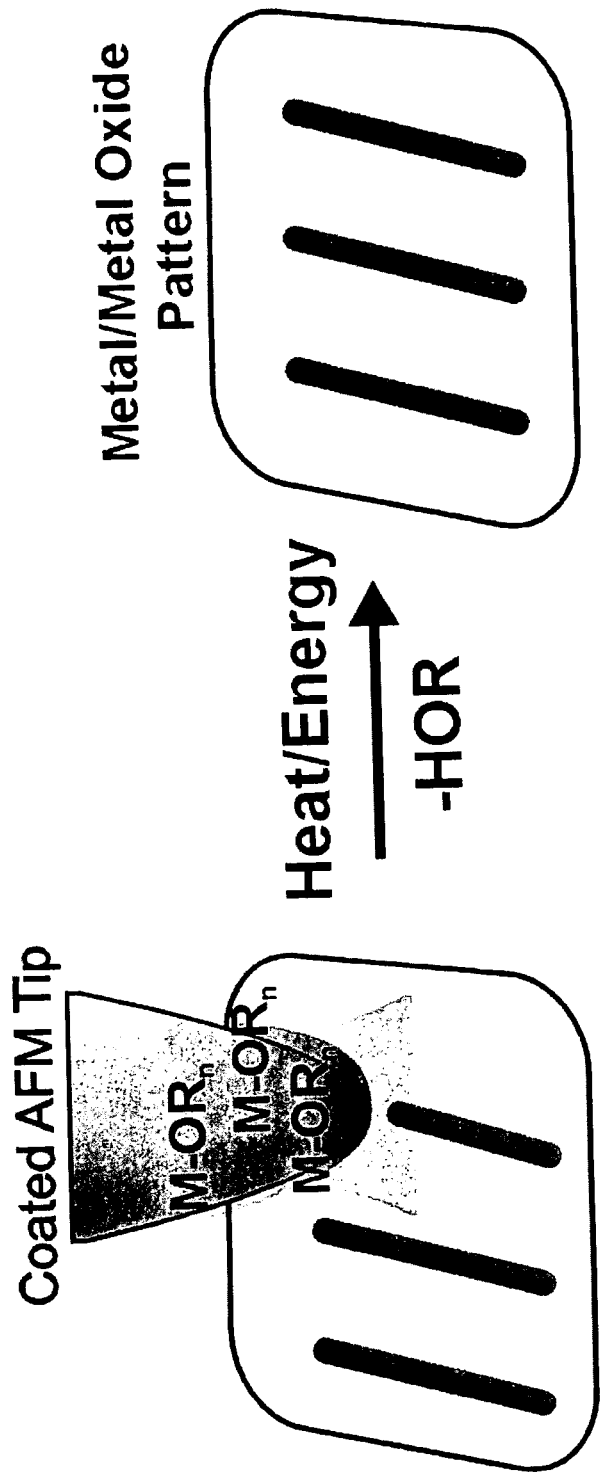
FIG. 5 illustrates metal/metal oxide patterning.

The soft metal-organic hybrid structures were decomposed in a final step in the presence of oxygen to yield the corresponding metal oxide, see FIG. 5, which illustrates deposition of metal oxides by DPN™ printing-depositing sol-gel inks, such as alkoxy complexes and polymers thereof (see provisional patent application in reference 13 above and its counterpart US patent publication 2003/0162004 cited below). The metal-organic hybrid structures formed during patterning are either used as is, or thermolyzed to yield the corresponding oxide. Metal/reduced form patterns may be obtained by pyrolysis in a reducing environment.

A similar methodology may be used to deposit opaque metal structures by heating instead in a reducing environment. Layers 5-10 nm in height will be written and thermolyzed to yield opaque structures. Potential pitfalls in this method are the use of high temperatures. This pitfall may be avoided by using no or a partial bake and make a direct use of the metalorganic polymer being deposited.

The following references may be used:

"*Sol-gel science: the physics and chemistry of sol-gel processing*", C. J. Brinker, G. W. Scherer, published by Harcourt in 1990.

"*Moving beyond molecules: Patterning solid-state features via dip-pen nanolithography with sol-based inks*", M. Su, X. G. Liu, S. Y. Li, V. Dravid, C. Mirkin, JACS 124(8): 1560-1561, 2002.

U.S. Patent Application No. 2003/0162004 A1 published to Mirkin, Chad A. et al. ("Patterning of solid state features by direct write nanolithographic printing")

Example 20

Opaque Structures Prepared by Sol-Gel Methods

The sol-gel precursor may be mixed with a nanoparticulate, for example carbon black, or other opacifying agents to opacify the resulting deposit.

The following references may be used and are incorporated herein by reference:

"Preparation of a silica gel carbon black composite by the sol gel process in the presence of polymer-grafted carbon black", K. Fujiki et al., *J. Materials Science,* 33(7): 1871-1879, 1998.

"Carbon black/alumina gel composite: Preparation by sol-gel process in the presence of polymer-grafted carbon black and its electric properties", N. Tsubokawa et al., *Journal of Polymer Science Part a-Polymer Chemistry* 37(18):3591-3597, 1999.

Additional description and working examples are provided to which can be used to repair masks, repair photomasks, fabricate masks, fabricate photomasks, and prepare nanostructures. For example, binary masks were prepared on silicon oxide.

FIG. 13

Figure 13:
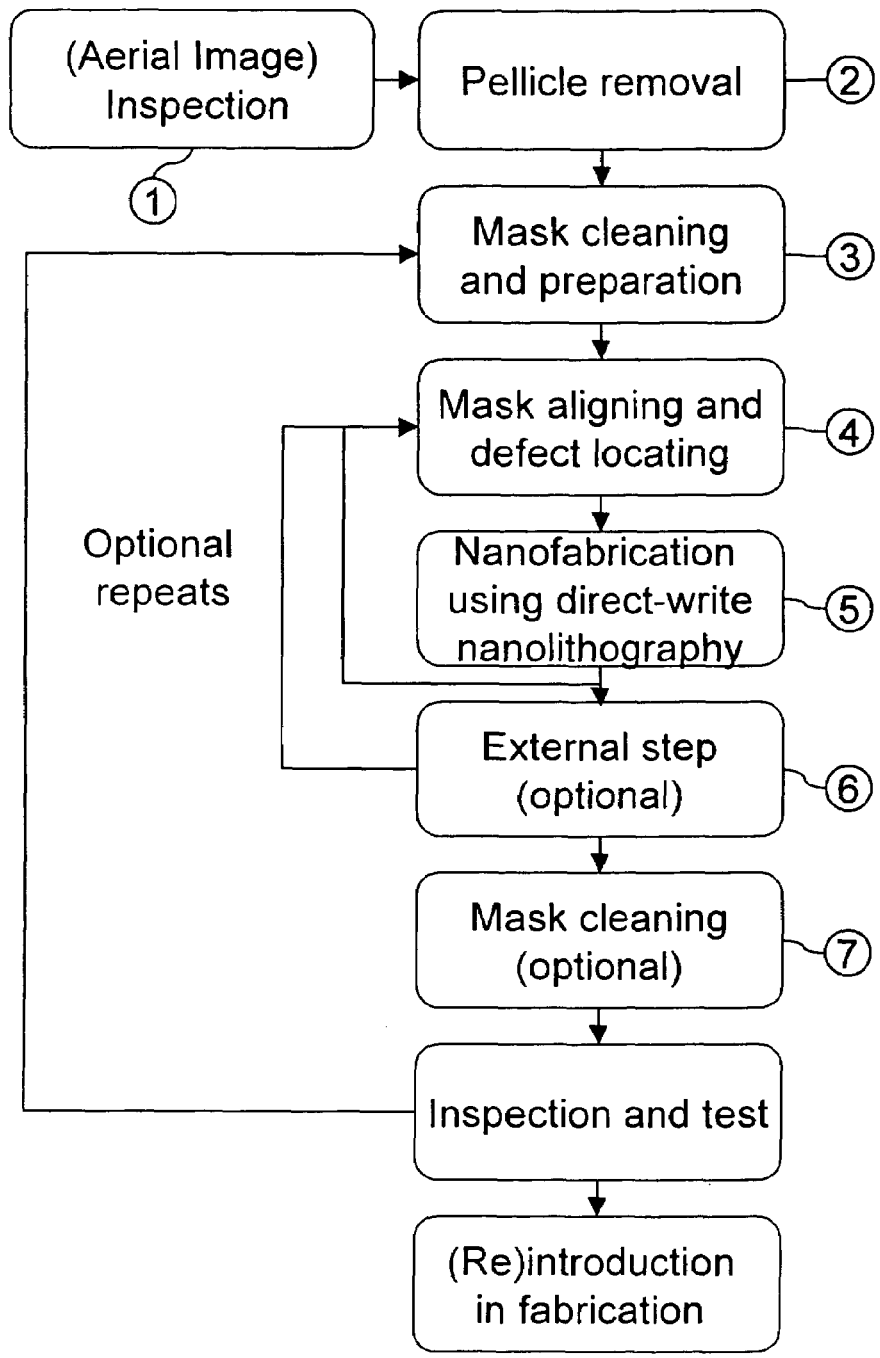
FIG. 13 illustrates a schematic of the mask repair process.

FIG. 13 illustrates a further schematic for a sequence of events in mask repair by nanodeposition; (1) the mask is inspected, e.g., using optical microscopy; If found to be defective, (2) the pellicle protecting the mask is removed; (3) the mask is cleaned of pellicle residue and other organic and/or inorganic contaminants; (4) the mask is placed in the repair apparatus, and aligned so that the previously identified defects could be precisely located; (5) the nanolithography probe is directed to the first defect; a first deposit is made; (6) If necessary, the wafer is submitted to an external process step, such as heating, UV irradiation, exposure to a chemical vapor, and the like that will induce layer curing. The process is repeated for each layer and each defect as required. (7) the mask is optionally cleaned, inspected (as in step 1) for unrepaired defects and reintroduced in fabrication if judged of sufficiently good quality such as, for example, production-quality.

Figure 14A:
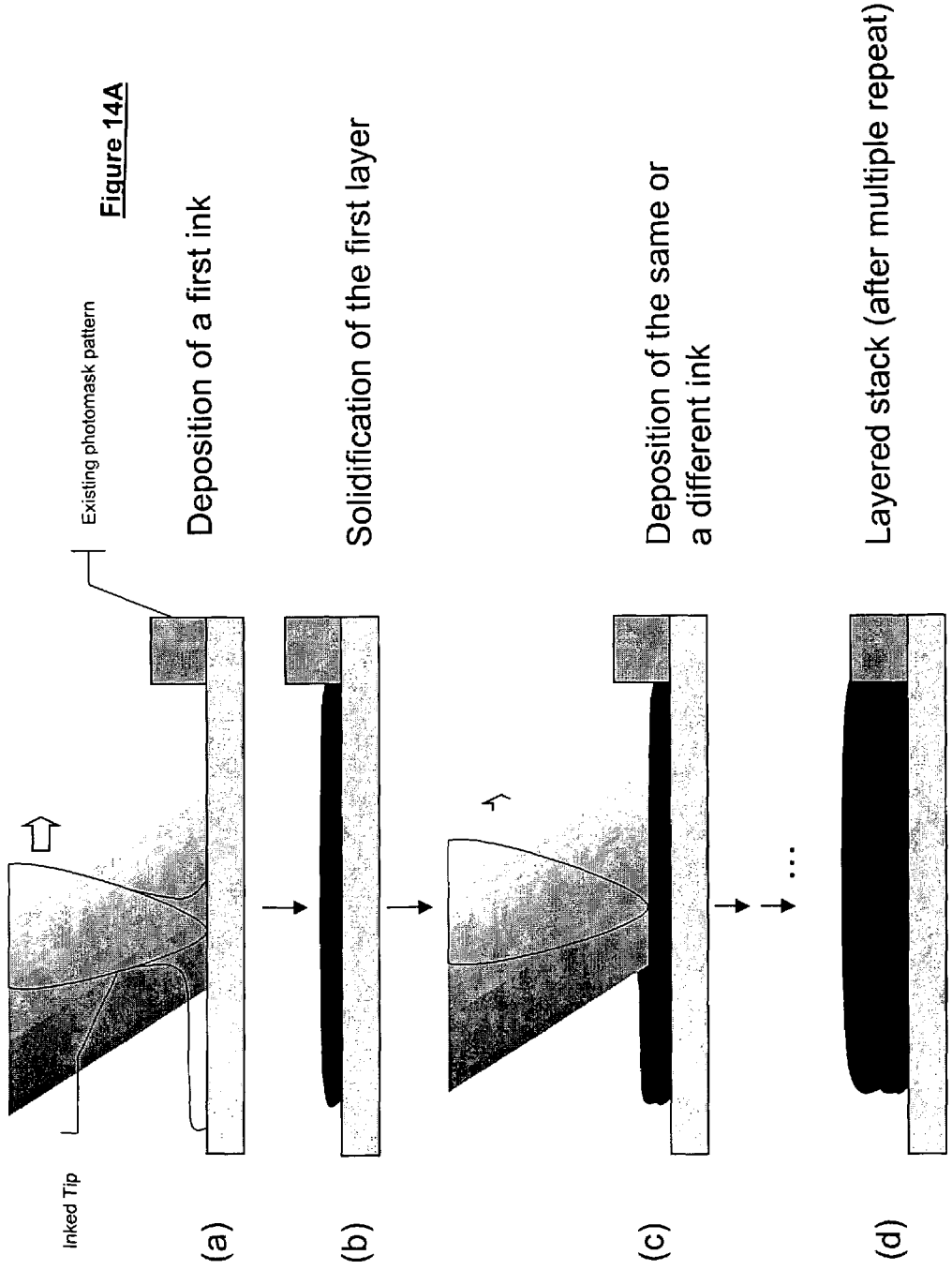

FIGS. 14A and 14B

FIGS. 14A and 14B illustrate formation of a layered stack, wherein the resulting height and absorption are consistent with the photomask. Schematic illustrating [A] a method of stacking multiple layers to form a pattern of sufficient height, when one may not be made in a single deposition step; and [B] a method of enhancing the pattern as deposited to meet edge placement, line edge roughness, sidewall angle and/or thickness objectives (and thus optical properties) for the repair. [A] (a) a first layer of a first ink is deposited via direct-write deposition nanolithography in a clear defect. The leftmost object represents a preexisting mask pattern. (b) the ink is cured, e.g. by chemical reaction, heating or exposure to UV light, so that (c) another layer of the same or a different ink may be deposited above the first. (d) the process may be repeated once or multiple times, until an appropriate height is reached. [B] (e) the geometric characteristics of a pattern formed by deposition nanolithography (which may be composed of one or multiple layers) is improved by locally applying a high contact force, depositing a chemical etchant or by a combination of both (in a manner similar to chemical mechanical polishing). Step (f) demonstrates the possible result of lapping along an edge to achieve a high sidewall angle, while (g) illustrates equalizing the pattern height and decreasing its roughness.

Nanolithography can be used to deposit a capping layer on top of an existing deposit, the function of the capping layer being, for example, to protect the deposit during subsequent mask cleaning steps and promote adhesion of said deposit to the substrate. For example, the capping layer may be, for example, sol-gel precursor deposited on a metallic deposit.

Part 7

Repair of Advanced (PSM) Photomasks and Next-Generation Lithography Masks

Additional description about masks is provided. Many of the techniques for repair of COG also apply to advanced photomask (APSM, AAMPSM) and NGL mask technologies (EUV, EPL, and the like), while there are great economic incentive to repair these kinds of masks.

Phase shifting masks take advantage of destructive interference at pattern edges to improve contrast. Alternating Aperture PSMs, also called strong-shifters, are fabricated by etching 180°-phase-shifting windows in alternating clear areas of the quartz mask. Repair technologies in this area focus on repairing substrate defects, such as removing quartz bumps and filling quartz pits with a quartz-like material ["Alternating phase shift mask defect printability for 130 nm and 100 nm KrF lithography", Kim et al., International SEMATECH, May 19, 2000]. This may be achieved with sol-gel deposition methods.

Attenuating PSM (weak-shifters) relies on the deposition of a partially transmitting, phase-shifting material (e.g. molybdenum silicide). Light diffracted from a clear opening in the photomask will destructively interfere with light leaking from the phase-shifted areas, improving contrast. Additive repair of the phase-shifting layer relies on the deposition of a layer with similar overall optical properties (transparency, index of refraction), which may be achieved by precise control of the chemistry and the thickness of the patch. The deposition of nanoparticle embedded in a transparent sol-gel-like inorganic binder has been described in "Electrical characterization of polymethylsiloxane/$MoSi_2$-derived composite ceramic", J. Cordelair, P. Greil, J. Am. Cer. Soc. 84(10): 2256-2259, 2001.

Next Generation Lithographies (NGL) are being developed to replace DUV/VUV lithography at the 2006-2013 time horizon for critical dimensions (CD) inferior to 70 nm. The primary contender is Extreme UV (EUV, 14.6 nm). Other technologies, including electron projection lithography (EPL), including SCAPEL, and X-ray lithography (1 nm) are being considered. In addition, Nanoimprint Lithography (NIL), a stamping technology, might also find a niche market for small-series applications. In this method, a mask is used as a mold (also called a mold) to press or stamp in a structure. See, for example, U.S. Pat. Nos. 5,772,905 and 6,309,580 to Chou. Repair and fabrication of nanoimprinting masks are part of the present invention.

EUV masks currently being developed consist of diffractive reflectors containing as many as 40 alternating layers (e.g. Mo/Si), coated with a buffer layer (typically silicon oxide, silicon oxynitride (100 nm), sometimes C (75 nm) films) and an absorber pattern (typically Cr or TaN, 30-50 nm thick) [Hector et al., J. Vac. Sci. Tech. B, 19(6):2612-2616, and J. R. Wasson et al., J. Vac. Sci. Tech. B, 19(6):2635-November-December 2001].

Because of the nature of the absorber and the presence of a protecting buffer layer on the EUV mirror, the nanodeposition repair techniques proposed for traditional photomasks (metal deposition, for example) can be transferable to EUV masks. Furthermore, it is noted that most materials strongly absorb at EUV wavelengths, facilitating the choice of the chemical composition of the repair patch.

X-ray lithography and EPL masks are typically thin membranes (e.g. Si) supporting an absorber pattern (e.g. Au) or stencils. In the former case, metal deposition methods, as disclosed above can be used.

in NanoImprinting Lithography (NIL), a nanometer-scale mold is pressed against a soft substrate in the manner of a waffle-iron ["Imprint of sub-25 nm vias and trenches in polymers", S. Y. Chou, P. R. Krauss, P. J. Renstorm, *Appl. Phys. Letters* 67(21):31114-3116, 1995; "Multilevel nanoimprint lithography with submicron alignment over 4 in. Si wafers", W. Zhang and S. Y. Chou, *Appl. Phys. Letter* 79(6):845]. NIL equipments are available from Nanonex, EV Group, Obducat, and Molecular Imprints, Inc. the later company commercializes Step & Flash™ Imprint Lithography (S-FIL™), wherein a transparent stamp is pressed in contact with a substrate coated with a curable photopolymer and illuminated with UV light. The stamp, which has been previously coated with a release layer, is then removed, yielding a photopolymer imprint. Further etching steps transfer the pattern to the underlying substrate and the process is repeated with another wafer. Stamps/molds are typically made of quartz (S-FIL), silicon dioxide on silicon, with etched features 100-250 nm deep, and are typically prepared by e-beam lithography (PSM mask technology) followed by reactive ion etching (RIE). Those skilled in the art will recognize that similar masks are used by several variants of that methodology (including microcontact printing). For this invention, these molds and stamps are masks and can be fabricated and repaired by the methods described herein.

Because NIL masks/molds are most frequently made of the same materials than photomask blank, the photomask substrate repair methods outlined above (esp. sol-gel) are directly applicable.

The programmed shrinking of mask feature sizes and stringent critical dimension control requirements make defect inspection and repair absolutely critical for advanced mask technologies. A high-precision tool, capable of nanometer-scale XY control and able to process multiple layers with high Z resolution is therefore required for the fabrication and repair of masks for emerging lithographies.

In contrast with photomasks or EUV masks, which have a 4:1 or 5:1 mask-to-wafer-feature-size ratio, NIL masks are 1:1. Already, mask feature sizes are beyond the capabilities of traditional repair tools. Direct-write nanolithography is therefore extremely attractive for the repair of NIL molds.

Part 8

Methods to Enhance the Rate of Ink Deposition From a Tip and Its Ink Capacity

Example 21

Enhanced Deposition Using a Polymer-Coated "DPN Stamp Tip"

Photomask repair via deposition nanolithography requires the deposition of a sizable amount of materials (about a thousandth of a micron cube), compared to amounts generally present on an AFM-cantilever-style silicon nitride tip in a minimum amount of time. It is therefore advantageous to modify DPN probes in a way such as (1) more ink may be retained on the tip, when delivered to it; and (2) more ink may be deposited, when the tip is used.

One modification involves coating the tip with a semi-porous and/or gelatinous layer, for example a siloxane polymer or copolymer like polydimethylsiloxane (PDMS) or a copolymer thereof. Without wishing to be bound by theory, it is believed that (1) the polymer forms a spongious coating that stores ink; and (2) that the contact area between the tip and sample is increased by the polymeric coating, which in turn increases the overall rate of ink deposition.

In the following working examples, the following recipe for preparing sol-gel ink was used: 40 μL of MEOS (Methoxy Ethoxy Ortho Silicate) and 10 μL of 10% Pluronic (a block copolymer of ethylene oxide and propylene oxide, commercialized by BASF, Ludwigshafen, Germany) made in water. After depositing sol-gel structures, they were cured for 6 min at 120° C. after deposition. After the curing, the nanostructures were resistant to mild sonication, piranha (3:1 mixture of concentrated sulfuric acid and hydrogen peroxide) and RCA2 treatment (5:1:1 mixture of water, hydrogen peroxide, and ammonium hydroxide).

For depositing metal ink in the features, the following procedure was used: A saturated solution of sodium tetrachloropalladate II was prepared in Ethylene Glycol (80% in water). After deposition, the metal salt was reduced to metal by exposing it to DMAB vapor for 15-30 sec and then heating the substrate to a temperature of 120° C.-160° C. for 10 min. The method of reducing a metal salt in presence of an alcohol is based on the poyiol process.

The following procedure illustrates the fabrication of a PDMS-coated tip (see FIG. 24):

A Si or Si/SiO$_x$ substrate (2×2 cm$^2$) and a Si$_3$N$_4$ tip were immersed into a boiling mixture of H$_2$O$_2$:NH$_4$OH:H$_2$O, 1:1:5 (v:v:v) for about one hour, then rinsed with double deionized H$_2$O (provided by e.g. Milli-Q equipment) and dried in a flow of pure nitrogen (N$_2$).

A silicone elastomer and a silicone elastomer curing agent (Sylgard 184 silicone elastomer kit, Dow Corning corporation, Midland, Mich.) was mixed together in a 10:1 ratio (w/w). The resulting elastomer is essentially pure polydimethylsiloxane.

A droplet of the mixture was placed onto the cleaned Si or Si/SiOx substrate and put onto the sample stage of an atomic force microscope. A clean Si$_3$N$_4$ microcantilever (available from NanoInk, Inc.) was mounted into the tip holder. The Si$_3$N$_4$ tip was placed in contact with the silicone mixture, then retracted. The procedure was repeated again.

The coated tip was placed in an oven for 12 hours at 60-70° C. to completely cure the polymer coating.

Figure 25:
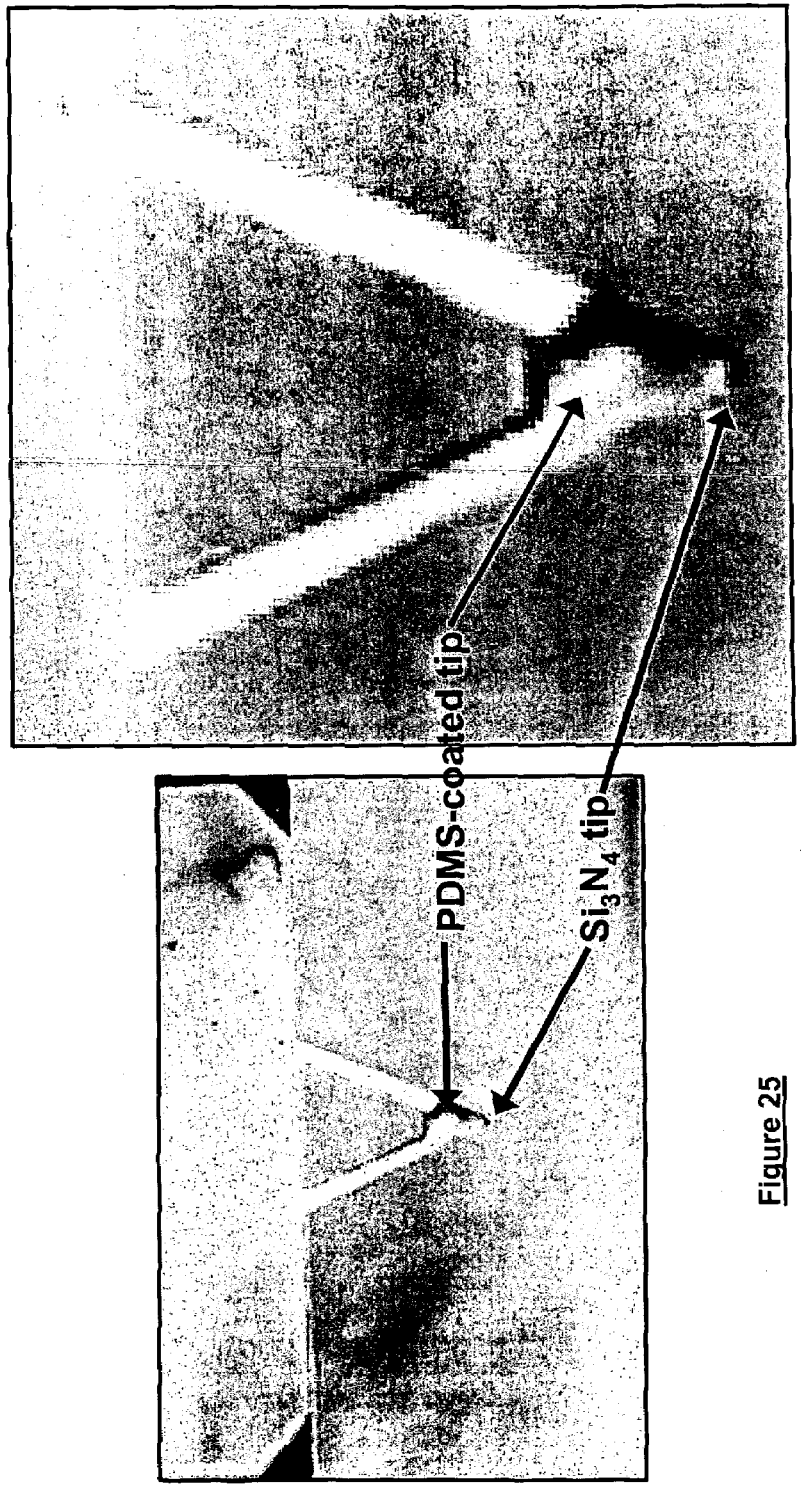
FIG. 25 shows elastomer modified tips.

An optical image of a cantilever terminated by such a tip is shown in FIG. 25.

Before lithography, the finished tip is inked by dipping in an appropriate solution and drying it in air.

Standard Si$_3$N$_4$ tip may be exchanged with a polymer-coated tip without need for a retuning of experimental parameters.

Advantages of coated tips include:

The coating procedure is relatively and generally easy, low-cost and has a high success rate (near 100%).

Nanodeposition with coated tips combines the advantage of DPN and micro-contact printing (μCP), but has higher resolution (sub-100 nm) than μCP.

Such a coated tip may pattern fully liquid inks or ink still dissolved in a solvent.

Coated tips can still be used for AFM imaging.

As opposed to methods described in "Scanning probe with elastomeric (PDMS) tip for scanning probe microcontact printing (SP-uCP), X. Wang, K. Ryu, D. Bullen, J. Zou, C. Mirkin, C. Liu, (Langmuir, 2003) no lengthy tip fabrication procedure is required.

Other polymers and non-polymeric compounds may be used as the tip coating as well, including (a) alkyl- and aryl-siloxane type polymers and (b) fluorinated polymers. In general, polymers which were found suitable for microcontact printing [Wilbur et al., Advanced materials 6(7-8):600-604, 1994] and similar soft lithography can be used.

Working Examples with PDMS Tip
(Polydimethylsiloxane)

Figure 24:
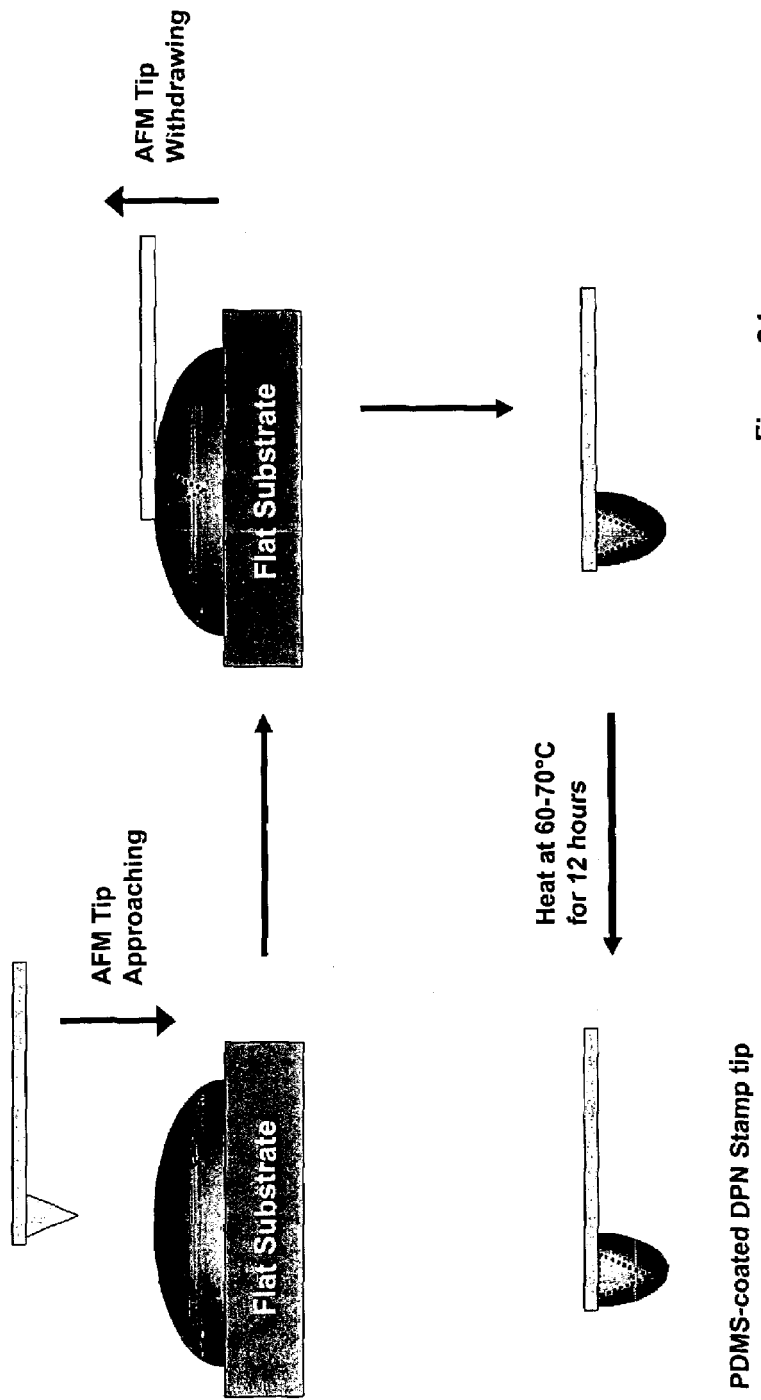
FIG. 24 illustrates elastomer tip modification.

The procedure is illustrated in FIG. 24. A piece of Si or Si/SiOx substrate (2×2 cm$^2$) and a Si$_3$N$_4$ tip were immersed into a boiling mixture (H$_2$O$_2$:NH$_4$OH:H$_2$O=1:1:5 (v:v:v)) for about one hour, then rinsed with Milli-Q H$_2$O and dried with pure N$_2$.

Mixture 1: completely mixed silicone elastomer and silicone elastomer curing agent (Sylgard 184 silicone elastomer kit, Dow corning corporation, Midland, Mich., 48686-0994) at a ratio 10:1 (w/w). Took a droplet of the mixture 1 onto the cleaned Si or Si/SiOx substrate and put it onto the sample stage of an AFM. Mounted a clean Si$_3$N$_4$ into the tip holder. Moved the Si$_3$N$_4$ tip to touch the mixture 1 and retracted the tip, repeated it again. Took the tip out and put it in an oven for 12 hours at 60-70° C. Took the tip out and the DPN stamp tip was fabricated (see the optical image, FIG. 25).

The experimental conditions in the photomask experiment done with a DPN stamp tip was the same as that done with a Si$_3$N$_4$ tip. Only changed the Si$_3$N$_4$ tip to DPN stamp tip.

Besides PDMS, other hydrophobic polymers, elastic polymers, and thermosetting systems can be used as well, including polysiloxane type polymers and alkyl- and aryl-siloxane type polymers and flourinated polymers. In general, polymers which are suitable for microcontact printing and soft lithography can be used.

The following figures provide additional working examples of the invention:

FIG. 15

Figure 15:
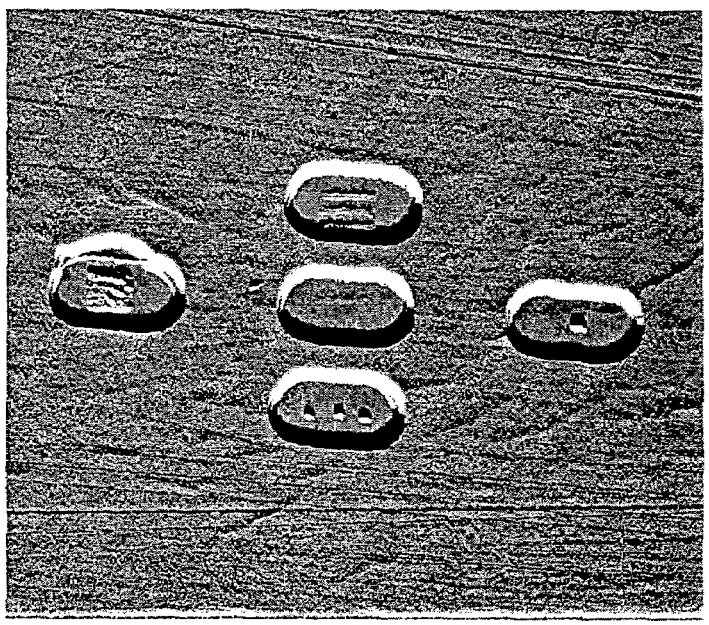
FIG. 15 shows defective mask structures.

FIG. 15 (working example) shows a zoomed out view of the deposited structures. Sol gel structures were written in one of the smallest features in binary mask (test masks can be obtained from commercial suppliers). The features (5 holes) in the mask were one micron by two microns. Nanostructures were created in smaller features also.

FIG. 16

FIG. 16 (working example) shows the target feature used for deposition of sol-gel structures on a test mask. The dimensions of the hole were length (two microns), width (one micron), and height (75 nm).

FIG. 17

Figure 17:
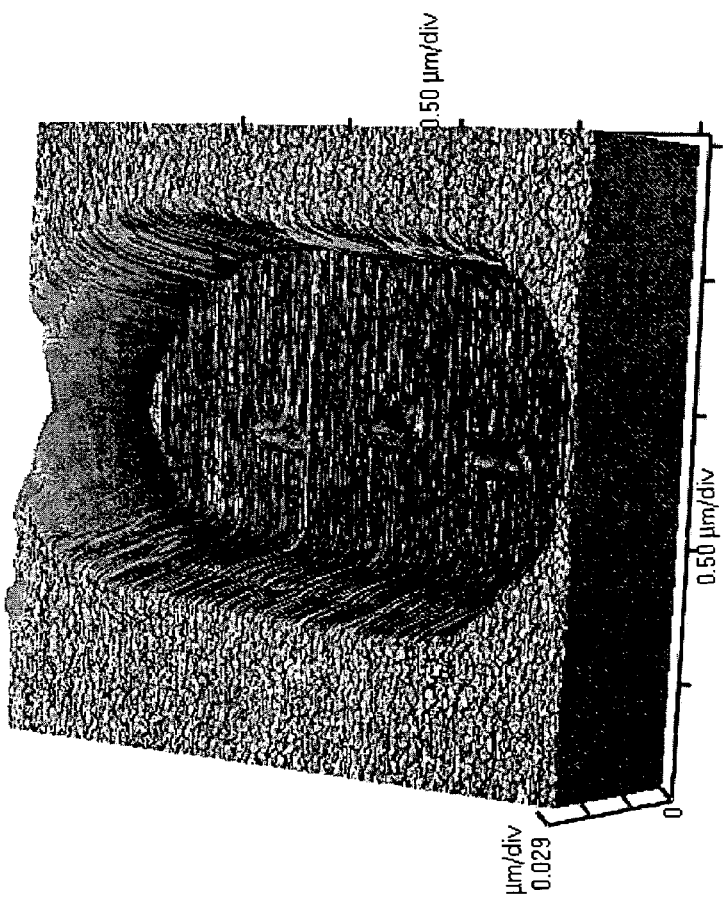
FIG. 17 shows initial additive repair (dots).

In FIG. 17 (working example), dots were created demonstrating the control over height of the feature and the registration. The dimensions starting from the top feature:

| Height (nm) | Width (nm) | Time (minutes) |
| --- | --- | --- |
| 17 | 128 | 3 |
| 17.5 | 150 | 3.5 |
| 18.5 | 163 | 4 |

FIG. 18

Figure 18:
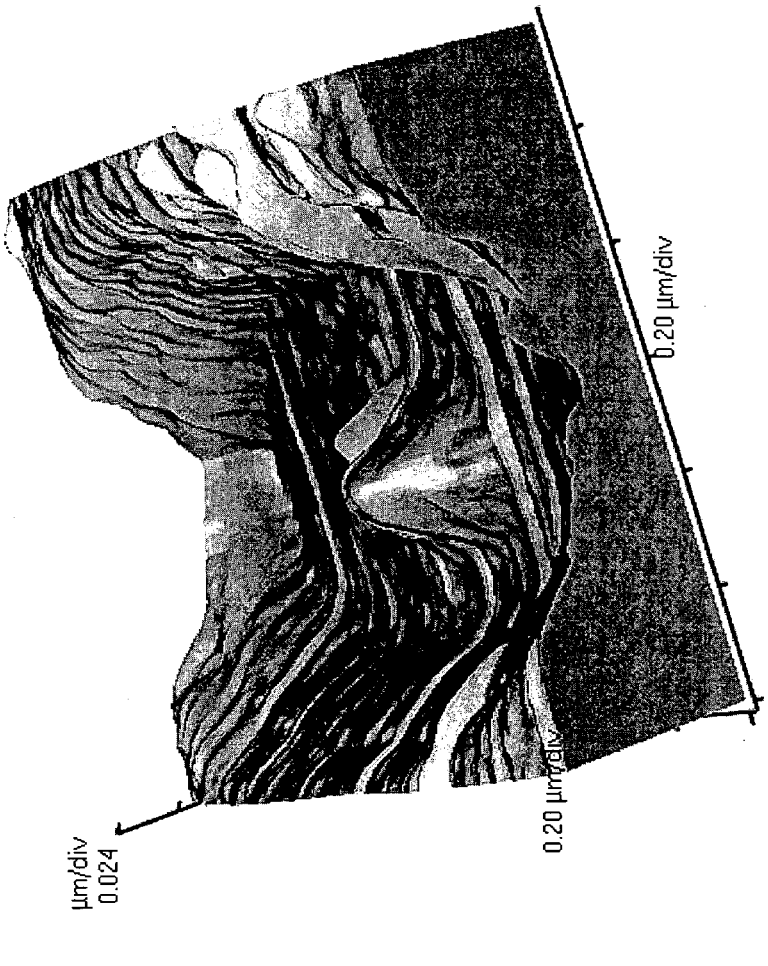
FIG. 18 shows initial additive repair, with a high dot.

In FIG. 18 (working example), a high dot 45.3 nm tall was created in the test mask by holding the tip coated with sol-gel for 15 minutes. This demonstrated the ability to create very high nanostructures without losing control over the length and width dimensions (x and y).

The height is not particularly limited by this working example. The height can be, for example, about 5 nm to about 200 nm, and more particularly, about 10 nm to about 200 nm, and more particularly, about 10 nm to about 100 nm, and more particularly, about 25 nm to about 75 nm. It can be at least 30, at least 45, at least 55, at least 100, or at least 150 nm high. The number of layers is not particularly limited but can be, for example, two to twenty layers, or more particularly, three to fifteen layers. It can also be a single layer, forming an integral structure.

FIG. 19

Figure 19:
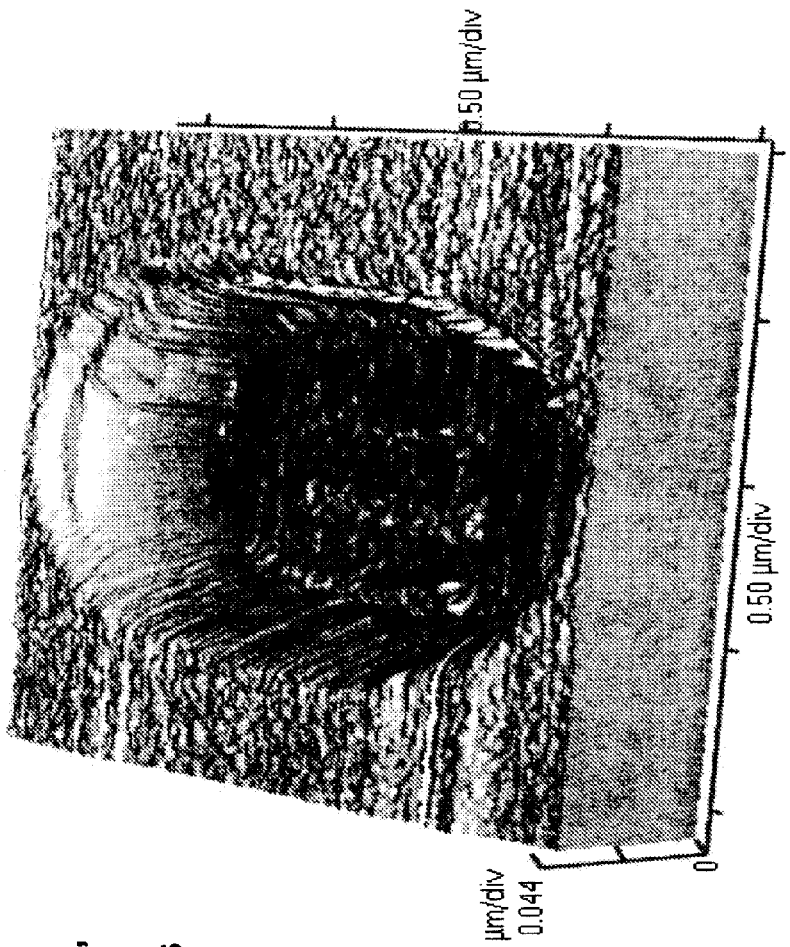
FIG. 19 shows initial additive repair (lines).

In FIG. 19 (working example), three lines were created, including one line substantially exactly alongside the defect edge. The dimensions for the lines starting from the left were:

| Height (nm) | Width (nm) | Time (minutes) |
|---|---|---|
| 15 | 162 | 6 |
| 10 | 150 | 5 |
| 5 | 138 | 4 |

FIG. 20

Figure 20:
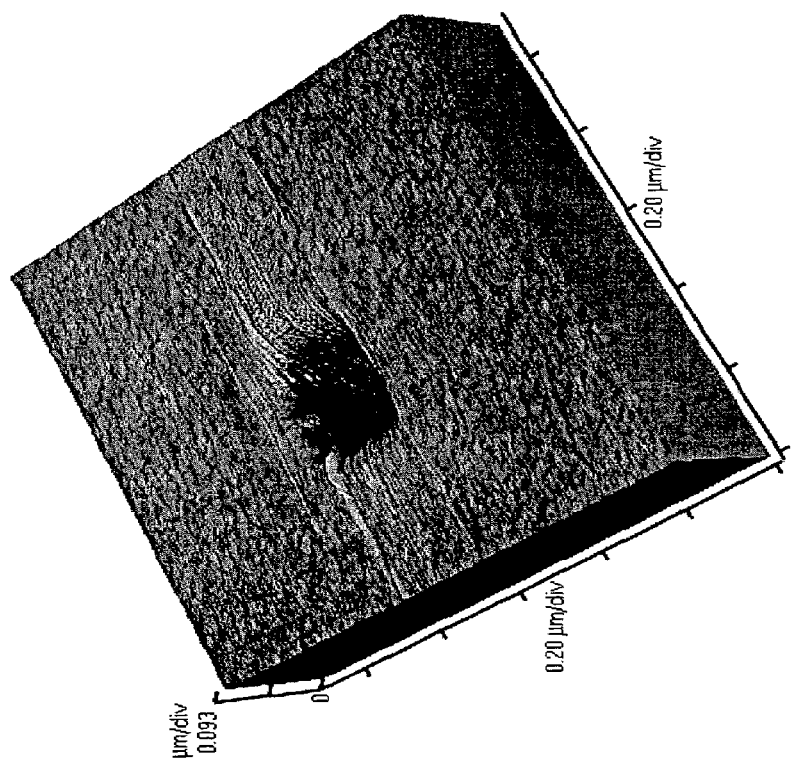
FIG. 20 shows defective mask structure with nanoscale hole.

FIG. 20 (working example) illustrates the target hole on FIBics Structures for deposition of metal salt and sol-gel structures. The hole was about 200 nm wide and about 100 nm deep.

FIG. 21

Figure 21:
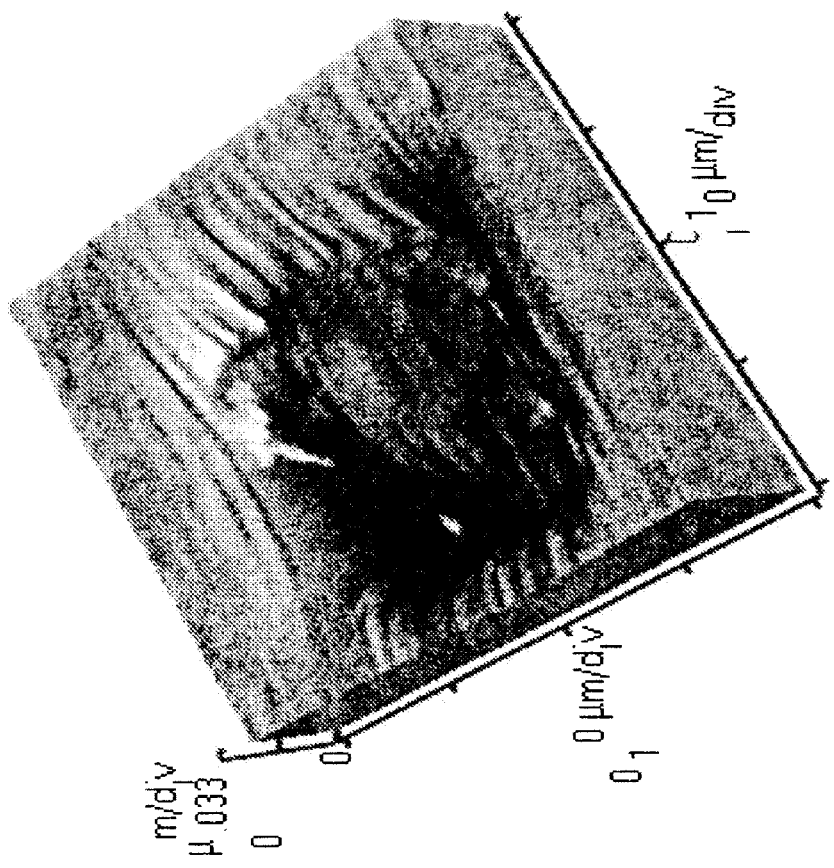
FIG. 21 shows initial additive repair.

FIG. 21 (working example) illustrates the filling up of a hole in features made with FIB. The average height of the feature deposited was 46 nm. A silicon nitride tip was used in this experiment. The dwelling time as 14 minutes. The deposited structure was cured at 120° C. for 6 minutes.

FIG. 22

Figure 22:
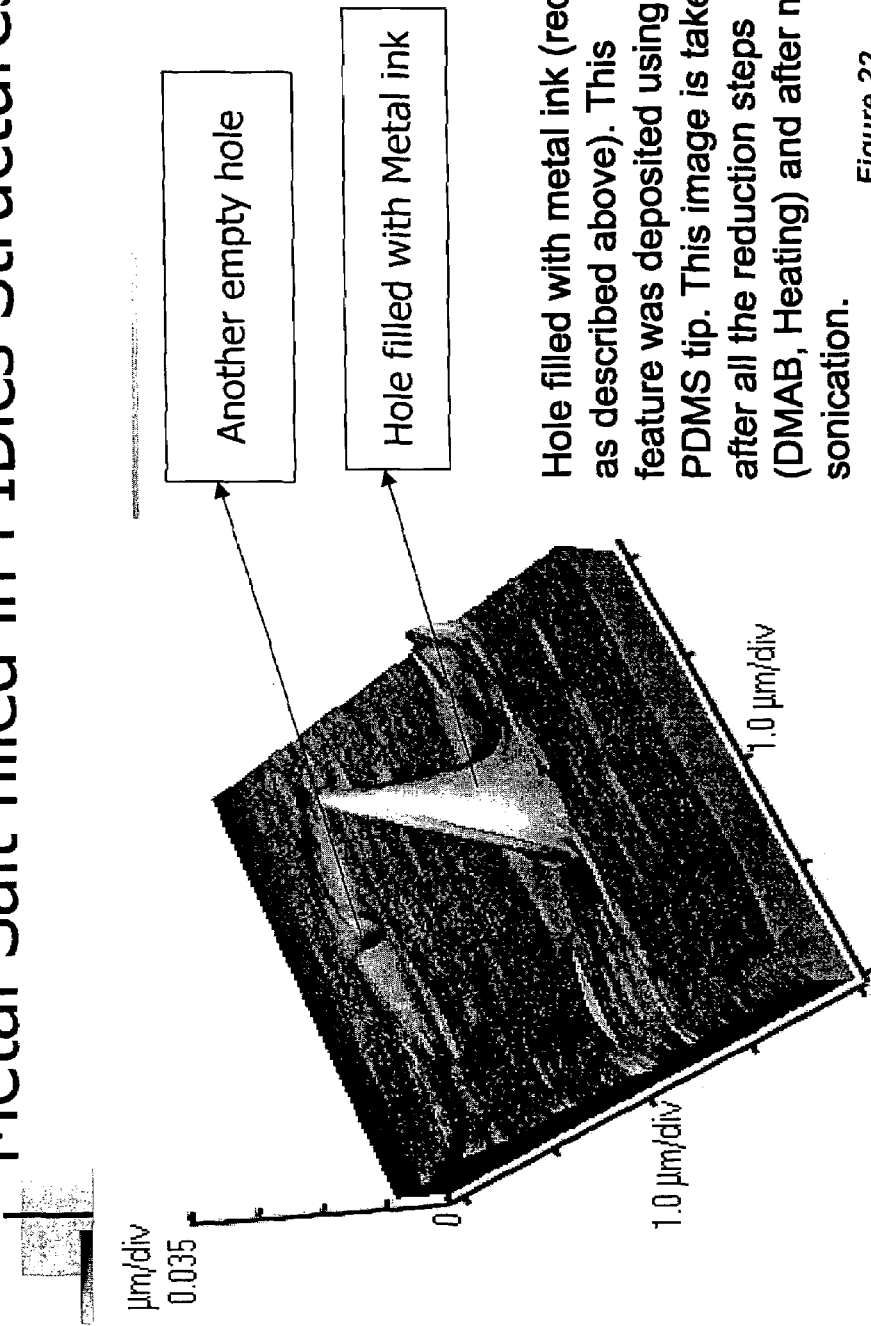
FIG. 22 shows additive repair.

FIG. 22 (working example) illustrates the metal salt filled in FIBics Structures. At the top, another empty hole is shown. At the bottom, a hole is shown which is filled with metal ink. The deposition was carried out with use of a PDMS tip. The image was taken after all the reduction steps (DMAB, heating) and after mild sonication. The height of the filled nanostructure is over 100 nm.

FIG. 23

Figure 23:
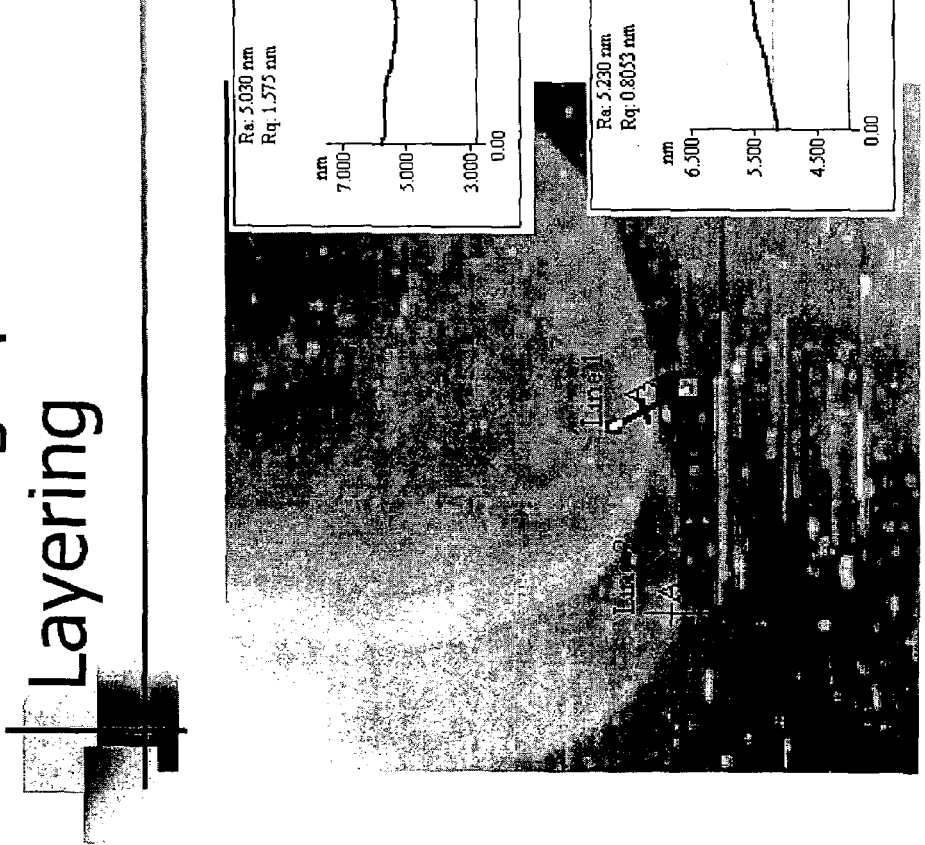
FIG. 23 shows multilayering repair.

FIG. 23 (working example) illustrates building up of metal structure by layering, layer by layer. First, a saturated solution of palladium chloride prepared in 80% ethylene/20% water was deposited using a PDMS-coated tip. The sample was taken out of the instrument, exposed to DMAB vapor for 15-30 seconds, and heated to 120°-160° C. The sample was replaced in the instrument and the procedure was repeated again. Each layer was about 2.2 nm in height; the stack formed by the two layers was about 4.6 nm high.

FIG. 24

FIG. 24 provides a schematic representation for fabrication of PDMS-Coated DPN Stamp tip.

FIG. 25

FIG. 25 (working example) provides optical microscopy images of a PDMS-Coated DPN stamp tip.

For working examples, all chemicals were bought from Aldrich (St. Louis, Mo.), unless otherwise noted.

Additional description of the invention is provided below.

Recent examples of photomask repair in the patent application publication literature includes the following references which can be used by one skilled in the art to practice the invention:
(a) 2003/0127441 to Haight et al. (published Jul. 10, 2003)
(b) 2003/0087200 to Border et al. (published May 8, 2003)
(c) 2002/0122992 to Kanamitsu et al. (published Sep. 5, 2002)
(d) 2002/0009843 to Kyushuo et al. (published Jan. 24, 2002)

Issued U.S. Patents include U.S. Pat. No. 6,165,649 to Grenon et al (Dec. 26, 2000) and U.S. Pat. No. 6,139,993 to Lee (Oct. 31, 2000).

A mask as used herein includes a photomask which is sized to expose an entire semiconductor wafer or substrate containing an entire integrated circuit, as well as a mask, such as a reticle, which is sized to expose only one area on the wafer or substrate, such as a single chip or die. The reticle is used to expose plural chips or die on a wafer or substrate by a step and repeat exposure method. Furthermore, the photomask is not limited to masks used for optical exposing radiation, but also includes masks suitable for UV, EUV, X-ray and electron beam exposure.

The present invention provides nanometer-scale functional features (including deposits, filled openings, and etched openings), as well as the enabling methods and apparatus. Examples of specific features to be fabricated include:
(a) Defect repair patches in transmission photomasks and reflection photomasks such as these used for extreme UV lithography. This includes the deposition of opaque or transparent materials, or their etching. For example, this includes building up or reducing the thickness of the partially transmitting material, such as $MoSi_2$ in an attenuating PSM or building up or reducing the thickness of the transparent material regions or windows in the strong PSM to adjust the phase shift of the radiation to as close as possible to 180 degrees. The photomasks may also be manufactured by this method, such as by depositing opaque or partially transmitting patterns on a transparent mask substrate or by building up or removing material in phase shift windows in strong PSMs to obtain a 180 phase difference due to the thickness difference of the PSM regions.
(b) Vias, lines and defect thereof, in microelectronic circuits, the application being the repair or fabrication of patterns of high-value chips; for example, this includes depositing metal into undesired openings in metal or metal silicide interconnect metallization in semiconductor or other solid state devices to repair the metallization, as well as to remove undesired deposits, such as undesired short circuits between metallization lines. Alternatively, a very thin gate insulating layer, such as a less than 10 nm thick gate insulating layer may be selectively deposited using an ink which forms an insulating layer, such as silicon oxide, silicon nitride or oxynitride and/or aluminum oxide. Alternatively, ultra narrow gate electrodes, such as MESFET or MOSFET gate electrodes, having a width of less than 10 nm may be selectively deposited using an ink which forms a conductive gate material, such as a metal or silicide.
(c) Filled defects in microelectromechanical systems (MEMS), the application being the repair, modification or testing of prototypes. For example, cantilevers and membranes in MEMS may be repaired or manufactured in this manner.

Optical properties are important for photomask repair. For repair of clear defects, the repair is opaque or absorbent at the wavelengths using during lithography. For repair of opaque defects, good transmissibility at the lithographic wavelength is used. It is desired that the repaired areas introduce minimal phase error. Preferably, the repaired area does not show up as a defect during inspection (e.g., there is a lack of scattering when observed; the repair should be opaque at the inspection wavelength.)

In addition, the deposit should not be damaged by mask cleaning steps during the lifetime of the mask. The deposit should adhere to the substrate and not be removed by a washing step, and it should withstand trace organics removal by Piranha or concentrated sodium hydroxide solutions. In general, the repair should not be damaged during lithography (e.g., by high-fluence UV irradiation) or at least should last for a significant fraction of the expected lifetime of the mask.

With respect to metrology, the pattern should be positioned in defect sites with high accuracy and repeatability; the lateral dimensions and height of the pattern should be controlled with high resolution; positioning and dimension control should be preserved when depositing pattern in successive steps/layers; the sidewall angle of the pattern should be close to 90° C. and the line edge roughness should be small. That which is acceptable can vary with the lithography and the technology node.

Photomask repair can be carried out with use of depositing of sol-gel inks and metal inks using a polyol process. In addition to chromium on glass (COG) masks, advanced COG-derived technologies (PSM, OPC) and of other techniques (EUV, x-ray masks) can be used. MoSi2, PSM, AAPSM, EUV, and EPL are all within the scope of the invention. There can be greater economic incentive to repair these kinds of masks.

For advanced photomask repair, the following reference can be used: "Issues for advanced reticle fabrication: (You want that reticle when?)", J. G. Maltabes, *Future Fab*, Vol. 11, Jun. 29, 2001]."

For NanoImprinting Lithography masks repair: in NanoImprinting Lithography (NIL), a nanometer-scale mold is pressed against a soft substrate in the manner of a waffle-iron ["Imprint of sub-25 nm vias and trenches in polymers", S. Y. Chou, P. R. Krauss, P. J. Renstorm, *Appl. Phys. Letters* 67(21):31114-3116, 1995; "Multilevel nanoimprint lithography with submicron alignment over 4 in. Si wafers", W. Zhang and S. Y. Chou, *Appl. Phys. Letter* 79(6):845]. NIL equipments are available from Nanonex, EV Group, Obducat, and Molecular Imprints, Inc. the later company commercializes Step & Flash™ Imprint Lithography (S-FIL™), wherein a transparent stamp is pressed in contact with a substrate coated with a curable photopolymer and illuminated with UV light. The stamp, which has been previously coated with a release layer, is then removed, yielding a photopolymer imprint. Further etching steps transfer the pattern to the underlying substrate and the process is repeated with another wafer. Stamps/molds are made of quartz (S-FIL), silicon dioxide on silicon, with etched features 100-250 nm deep, and are typically prepared by e-beam lithography (PSM mask technology) followed by reactive ion etching (RIE). Because NIL is a 1:1 replication technology, mask feature sizes are beyond the capabilities of traditional repair tools. Direct-write lithography is therefore extremely attractive for the repair of NIL molds. Those skilled in the art will recognize that several variants of that methodology exist that make use of similar masks. This includes microcontact printing molds.

For embodiments with carbon black in sol-gel, the following references can be used: "Preparation of a silica gel carbon black composite by the sol gel process in the presence of polymer-grafted carbon black", K. Fujiki et al., J. Materials Science, 33(7): 1871-1879, 1998. "Carbon black/alumina gel composite: Preparation by sol-gel process in the presence of polymer-grafted carbon black and its electric properties", N. Tsubokawa et al., Journal of Polymer Science Part A—Polymer Chemistry 37(18):3591-3597, 1999.

For embodiments in a $MoSi_2$ attenuating phase-shifting photomask repair:

"The deposition of $MoSi_2$ nanoparticle embedded in a transparent inorganic binder has been described in "Electrical characterization of polymethylsiloxane/$MoSi_2$-derived composite ceramic", J. Cordelair, P. Greil, J. Am. Cer. Soc. 84(10):2256-2259, 2001."

For embodiments with a near-field photomask repair:

"Near-field photomask repair with a femtosecond laser", Lieberman et al., Journal of Microscopy, Vol. 194, Pt 2/3, May/June 1999, pp. 537-541]

For embodiments with Chemical-Mechanical Etching of opaque defects, the following references can be used: Examples known in the art include the deposition of a chemical etchant from a hollow pipette. See for example "Fountain pen nanochemistry: Atomic Force control of chrome etching", A. Lewis et al. Applied Physics Letter 75(17), 2689, Oct. 1999 and references herein, hereby incorporated by reference. Methods of making said nanopipette can be found in U.S. Pat. No. 6,600,856 to Lewis, and U.S. Pat. No. 6,396,966 to Lewis et al.

Localized Deposition of Metal with Micropipette

See also "Localized electrochemical deposition of metals using micropipettes", a. D. Mueller et al. Thin Solid Films 336 (2000), 32-36.

U.S. patent application 2002/0122873 ("Nanolithography methods and products therefor and produced thereby", Mirkin et al.) describes methods to make and use of aperture probe tip capable to delivering For methods to repair defects in substrate: Quartz Bump Chemical Etching: In this working example, BOE (buffered oxide etch, a mixture of ammonium fluoride and hydroxide well-known to the art) is applied to a silicon nitride tip. Said tip is brought in contact with the area of the photomask substrate to be repaired. BOE etches silicon dioxide much quicker than silicon nitride, with a selectively better than 200:1. The process is repeated until the quartz bump is totally removed. Optionally, a compound capable of neutralizing excess etchant may be applied with a second tip. The reticle is optionally washed to eliminate residues.

Quantitative Requirements for Defect Repairs

The following reference can be referred to:—"Near-field optical photomask repair with a femtosecond laser", Lieberman et al. Journal of Microscopy Vol. 194, Pt. 2/3, May/June 1999, pp. 537-541.

High-resolution repair methods can be used. In preferred embodiments, the following parameters can be used: an edge placement better than 50 nm, an accuracy of 2 um over the wafer, a scanner repeatability (pattern placement) of 20 nm, a 400 nm aperture (resolution), and an edge placement equal to 10% of the CD.

Handle data from mask inspection tools

Handle 6"×6" mask plates; >5"×5" writing area the mask wafer should not be submitted to temperature above 200° C.

In-Situ Curing Methods

In many aforementioned embodiments, post-deposition steps, in which one or more inks are transformed from their as-deposited chemical and/or physical state into another (by irradiation, by heating, reaction with a liquid, gas or vapor, etc. . . . ), are carried out to give the deposit its permanent properties. For example, the deposit may be reduced, polymerized, or sintered to obtain the appropriate opacity, chemical resistance and substrate adhesion.

The present embodiment of the invention relates to "in-situ" curing methods, wherein this transformation is triggered locally and/or within the nanolithography process flow. It further relates to methods to cure the ink deposited on the substrate, but not the ink still present on the tip. For example, this methodology would eliminate the need to remove the substrate (e.g. mask) from the nanolithography apparatus to submit it to an external processing step.

The methods disclosed herein are especially useful, when more than one layer must be deposited to meet the desired specifications (thickness, transparency). Building structures layer-by-layer is disclosed above.

In a first embodiment of this invention, a first probe is used to deposit a first ink in the area of interest (e.g. defect). A second probe is then brought in the vicinity of the first deposit and delivers a second ink. The process may be extended to three or more probes.

In a preferred embodiment, the inks are chosen to be chemically reactive with or in the presence of one another (in the later case, one or more chemical compounds in one ink catalyze the chemical reaction of one or more chemical compounds of another ink). For example, inks 1 and 2 could comprise a metal salt and a reducing agent, respectively. Mixing inks 1 and 2 results in the formation of a metal pattern while minimizing the need for heating or exposure of the whole mask to a reducing agent vapor. See FIG. 26.

In another embodiment, the inks are deposited in such a way that a gradient in chemical composition and therefore physical properties is present in the resulting pattern. Preferably, a vertical gradient is established.

Preferably, the probes used to deposit multiple inks belong to the same probe array and have been inked by dipping into an array of ink wells containing said inks, as disclosed in U.S. Patent Provisional Application Ser. No. 60/425,252 filed Nov. 12, 2003 to Cruchon-Dupeyrat et al.

The process may be repeated one or more times and may be combined with layer-by-layer deposition.

In a fourth embodiment of this invention, a transformable (e.g. photosensitive or heat-sensitive) material is deposited with a first probe. A second probe is used to irradiate said deposit with electromagnetic radiation or heat it locally. For example, the second probe may be a near-field scanning optical microscopy (NSOM) probe capable of delivering light and a scanning thermal microscopy tip capable to locally heating the substrate.

In a fifth embodiment, a probe is used to deposit an ink in an area of interest. The deposit is then submitted to transformation means, while the deposition probe is kept away from the substrate to pattern or is otherwise protected, so that curing of the precursor ink on the probe itself is prevented. For example, a laser beam may be used to irradiate the deposit and its vicinity, curing it either thermally or optically (FIG. 27). The probe may be shielded from laser radiation by moving it way from the illuminated spot.

In another example, light is injected in the (transparent) substrate, in such way that it is totally internally reflected in proximity of the deposit, triggering e.g. its photoreduction or photopolymerization. The probe may be retracted from the substrate surface by a few microns to keep it off the evanescent wave.

In a third example, the deposition means is a hollow probe, such as a nanopipette, which delivers a first ink. A second compound is present on the substrate or delivered nearby (e.g. in a gaseous form). Exposure of said first ink to said second compound results in the (chemical) transformation of said first and/or second on the substrate, but not within the nanopipette.

A fourth example involves a deposition probe kept thermally cold while the substrate is heated to a temperature where the ink being deposited transforms.

Preferred Embodiments

In conclusion, the invention provides for a series of preferred embodiments which include the following:

In embodiment 1, an article comprising at least one filled nanometer-scale opening. In embodiment 2, the article of embodiment 1, wherein the nanometer-scale opening before being filled is a defect. In embodiment 3, the article of claim 1, wherein the nanometer-scale opening before being filled is a defect in a photomask.

In embodiment 4, a method comprising filling one or more nanometer-scale opening(s). In embodiment 5, the method of embodiment 4, wherein the filling occurs by using a nanolithographic or nanofabrication method; In the embodiment 6, the method of embodiment 5, wherein the nanolithographic method comprises a deposition nanolithographic method; In embodiment 7, the method of embodiment 5, wherein the nanolithographic method comprises a direct write nanolithographic method. In embodiment 8, the method of embodiment 5, wherein the nanolithographic method comprises nanografting, meniscus nanografting, pick-and-place nanolithography, or nanopen reader writer; In embodiment 9, the method of any of embodiments 6-8, wherein the nanolithographic method comprises use of a material being deposited which comprises a metal. In embodiment 10, the method of any of embodiments 6-8, wherein the nanolithographic method comprises use of a material being deposited which comprises chromium, cobalt, nickel, tungsten, molybdenum or silver. In embodiment 11, the method of any embodiments 6-8, wherein the nanolithographic method comprises use of a material being deposited which is a metal oxide or a metal particle-containing solution. In embodiment 12, the method of any embodiment 6-8, wherein the nanolithographic method comprises use of a material being deposited which is opaque to electromagnetic radiation. In embodiment 13, the method of any embodiments 4-12, wherein the method comprises nanolithographic printing comprising use of a substrate which is a photomask.

In embodiment 14, the method for photomask repair comprising adding material to a defective photomask by direct write nanolithography with use of a scanning probe microscopic tip. In embodiment 15, the method according to embodiment 14, wherein the material is an optically transparent material upon the adding. In embodiment 16, the method according to embodiment 14, wherein the material is an optically opaque material upon adding. In embodiment 17, the method for photomask fabrication comprising adding material to a substrate to form a photomask by direct write nanolithography with use of a scanning probe microscopic tip.

In embodiment 18, a method for nanolithography comprising (1) providing a photomask substrate having at least one defect, (2) providing a scanning probe microscope tip, wherein the tip is coated with a patterning compound, (3) contacting the coated tip with the photomask substrate so that the compound is applied to the substrate so as to repair at least one defect.

In embodiment 19, a method for nanolithography comprising (1) providing a photomask substrate having at least one defect, (2) providing a scanning probe microscope tip, wherein the tip is coated with a patterning compound, (3)

using the coated tip to apply the compound to the substrate so as to repair at least one defect.

In embodiment 20, a method for nanolithography comprising (1) providing a photomask substrate having at least one defect, (2) providing a scanning probe microscope tip, wherein the tip is coated with a patterning compound, (3) contacting the coated tip with the photomask substrate so that the compound is added to the substrate.

In embodiment 21, a method for nanolithography comprising (1) providing a photomask substrate having at least one defect, (2) providing a scanning probe microscope tip, wherein the tip is coated with a patterning compound, (3) using the coated tip to add the compound to the substrate.

In embodiment 22, a method for nanolithography comprising using a coated scanning probe microscopic tip to deposit a patterning compound on a substrate in forming a photomask.

In embodiment 23, a method of inspecting and modifying an object using SPM technology, the method comprising the steps of:

inspecting the object by making SPM measurement of the object with a first SPM probe;

generating modification data from the SPM measurements that identifies a modification to be performed on the object's material; and in response to the modification data, performing the modification by adding material to the object's material with the first SPM probe or with a second SPM probe, wherein the adding of material is carried out by direct write nanolithographic printing by transfer of the material from the probe tip to the object.

In embodiment 24, the method according to embodiment 23, wherein the modification includes at least a structural modification of the object's material or a chemical modification of the object's material, and In embodiment 25, a method of inspecting and modifying an object using SPM technology, the method comprising the steps of:

inspecting the object by making SPM measurement of the object with a first SPM probe;

generating modification data from the SPM measurements that identifies a modification to be performed on the object's material; and in response to the modification data, performing the modification by adding material to the object's material with the first SPM probe or with a second SPM probe, wherein either the first SPM probe or the second SPM probe is an atomic force microscope tip coated with an ink which is the material added to the object's material.

In embodiment 26, a system for inspecting and modifying an object using SPM technology, the system comprising:

a set of SPM probes, including a probe used for inspecting which is configured to make one or more SPM measurements and a probe used for modifying which is configured to add material to the object's material, the probe used for inspecting and the probe used for modifying being the same probe or being separate probes;

a first component configured to inspect the object by making SPM measurements of the object using the probe used for inspecting;

a second component configured to generate modification data from the SPM measurements that identifies a modification to be performed on the object's material; and a third component configured to perform the modification by adding material to the object's material using the probe used for modifying, in accordance with the modification data;

wherein the adding of material is carried out by direct write nanolithographic printing.

In embodiment 27, a system for inspecting and modifying an object using SPM technology, the system comprising:

a set of SPM probes, including a probe used for inspecting which is configured to make one or more SPM measurements and a probe used for modifying which is configured to add material to the object's material, the probe used for inspecting and the probe used for modifying being the same probe or being separate probes;

a first component configured to inspect the object by making SPM measurements of the object using the probe used for inspecting;

a second component configured to generate modification data from the SPM measurements that identifies a modification to be performed on the object's material; and a third component configured to perform the modification by adding material to the object's material using the probe used for modifying, in accordance with the modification data;

wherein the probe used for modifying is an atomic force microscope tip coated with an ink which is the material added to the object's material.

In embodiment 28, a method for repairing a phase shift mask comprising (1) providing a phase shift mask, (2) providing a scanning probe microscope tip, wherein the tip is coated with a patterning compound, (3) using the coated tip to apply the compound to the mask so as to adjust a phase shift of radiation to be passed through the mask to 180 degrees.

In embodiment 29, the method of embodiment 28, wherein the tip comprises an AFM tip.

In embodiment 30, the method of embodiment 29, wherein the mask comprises a strong phase shift mask and the patterning compound adjusts a height of a transparent window in the mask.

In embodiment 31, the method of embodiment 29, wherein the mask comprises an attenuating phase shift mask and the patterning compound adjusts a height of a partially transmitting material on the mask.

In embodiment 32, a method for repairing an interconnect metallization over a solid state device comprising (1) providing a solid state device comprising an interconnect metallization, (2) providing a scanning probe microscope tip, wherein the tip is coated with a patterning compound, (3) using the coated tip to apply the compound to the metallization so as to fill an opening in the metallization.

In embodiment 33, a method of embodiment 32, wherein the tip comprises an AFM tip and the solid state device comprises a semiconductor device.

In embodiment 34, a method for forming a gate insulating layer of a field effect transistor, comprising providing a scanning probe microscope tip over a transistor channel, wherein the tip is coated with a patterning compound, using the coated tip to apply the a precursor compound to the channel and converting the precursor material to the gate insulating layer.

In embodiment 35, the method of embodiment 34, further comprising forming a gate electrode over the gate insulating layer.

In embodiment 36, the method of embodiment 35, wherein the gate insulating layer comprises silicon oxide.

In embodiment 37, a method for repairing a MEMS comprising (1) providing the MEMS, (2) providing a scanning probe microscope tip, wherein the tip is coated with a patterning compound, (3) using the coated tip to apply the compound to the MEMS to repair the MEMS.

Embodiment 38 is a method for depositing a material on a substrate comprising:
providing a tip comprising an elastomer at the tip end;
providing a patterning compound at the tip end;
providing a substrate;
depositing the patterning compound from the tip end to the substrate.

Embodiment 39 is the method according to embodiment 38, wherein the elastomer is a hydrophobic polymer. Embodiment 40 is a method according to embodiment 38, wherein the tip is a scanning probe microscope tip. Embodiment 41 is a method according to embodiment 38, wherein the tip is an atomic force microscope tip. Embodiment 42 is a method according to embodiment 38, wherein the substrate is a defective mask. Embodiment 43 is a method according to claim 38, wherein the patterning compound is a photomask repair ink. Embodiment 44 is a method according to embodiment 38, wherein the depositing step is used to fabricate a photomask for microlithography.

Embodiment 45 is a method of improving the deposition of materials from a tip comprising the step of modifying the tip with an elastomer. Embodiment 46 is a method according to embodiment 45, wherein the elastomer is a hydrophobic siloxane elastomer. Embodiment 47 is a method according to embodiment 45, wherein the tip is modified by coating the tip with an elastomer precursor and then converting the precursor to the elastomer. Embodiment 48 is a method according to embodiment 45, wherein the tip is a scanning probe microscope tip. Embodiment 49 is a method according to embodiment 45, wherein the tip is an atomic force microscope tip.

What is claimed is:

1. A method for additive repair of a phase shift mask in the semiconductor industry with fine control over lateral dimensions and height comprising:
providing a defective phase shift mask having a phase shifter in need of additive repair,
depositing material to the defective mask by direct write nanolithography from a tip for the additive repair wherein the tip is an atomic force microscope tip and wherein the material coats the tip, and wherein the material is a sol-gel material for repair of the phase shifter on the phase shift mask, and
converting the deposited sol-gel material to a solid oxide, which has optical transparency and index of refraction adapted for the additive repair of the phase shifter on the defective phase shift mask.

2. The method according to claim 1, wherein the defective phase shift mask further comprises an optically transparent substrate containing thereon a mask layer which is an optically opaque pattern.

3. The method according to claim 1, wherein the defective phase shift mask comprises a clear defect in the phase shifter.

4. The method according to claim 1, wherein the defective phase shift mask comprises a nanometer scale opening in the phase shifter to which the sol-gel material is added.

5. The method according to claim 1, wherein the defective phase shift mask comprises an opening in the phase shifter having a lateral dimension of less than about 100 nm to which the sol-gel material is added.

6. The method according to claim 1, wherein the defective phase shift mask comprises an opening in the phase shifter having a lateral dimension of less than about 80 nm to which the sol-gel material is added.

7. The method according to claim 1, wherein the defective phase shift mask comprises an opening having a lateral dimension of less than about 56 nm to which the material is added.

8. The method according to claim 1, wherein the defective phase shift mask comprises an opening in the phase shifter having a lateral dimension of less than about 35 nm to which the sol-gel material is added.

9. The method according to claim 1, wherein the defective phase shift mask comprises a feature of about 100 nm or less in lateral dimension that is repaired in the phase shifter.

10. The method according to claim 1, wherein the sol-gel material is applied as multiple layers.

11. The method according to claim 1, wherein the sol-gel material is applied to a height of at least 30 nm.

12. The method according to claim 1, wherein the sol-gel material is applied to a height of at least 45 nm.

13. The method according to claim 1, wherein the sol-gel material is applied to a height of at least 100 nm.

14. The method according to claim 1, wherein the sol-gel material is applied to a height of at least 150 nm.

15. The method according to claim 1, wherein the solid oxide is a metal oxide or glass.

16. The method according to claim 1, wherein the sol-gel material comprises one or more high molecular weight compounds.

17. The method according to claim 1, wherein the solid oxide has similar optical properties to the phase shifter which it is added.

18. The method of claim 1, wherein the additive repair is carried out without vacuum conditions.

19. The method of claim 1, wherein the additive repair is repeated with the same sol-gel material.

20. The method of claim 1, wherein the additive repair is repeated with different sol-gel material.

21. The method of claim 1, wherein the converting to form the solid oxide comprises external heating external heating, light irradiation, sonic excitation, or chemical reaction by exposure to a vapor or a liquid.

22. The method according to claim 1, wherein the of the sol-gel material is carried out as one of a series of depositing steps carried out with a plurality of tips.

23. The method according to claim 1, further comprising subtracting material from the defective phase shift mask.

24. The method according to claim 23, wherein the subtracting of material is carried out with use of a tip.

25. The method according to claim 23, wherein the subtracting of material is carried out with use of a scanning probe microscope tip.

26. The method according to claim 23, wherein the subtracting of material is carried out with use of an atomic force microscope tip.

27. The method according to claim 1, wherein the depositing of the sol-gel material is carried out without application of voltage bias between the atomic force microscope tip and the defective phase shift mask.

28. A method for nanolithography comprising: (1) providing a defective phase shift mask having a phase shifter in need of additive repair, (2) providing a scanning probe microscope tip, wherein the tip is coated with a patterning compound for the additive repair of the phase shifter, (3) contacting the coated tip with the phase shift mask so that the patterning compound is applied to the phase shifter, wherein the patterning compound is a sol-gel material for repair of the phase shifter on the phase shift mask, and converting the sol-gel material to a solid oxide, which has transparency and index of refraction adapted for the additive repair of the phase shifter on the phase shift mask.

29. The method according to claim 28, wherein the scanning probe microscope tip is an atomic force microscope tip.

30. The method according to claim 28, wherein the patterning compound comprises a metal.

31. The method according to claim 28, wherein the contacting step is repeated to form a repaired multilayer phase shifter structure.

32. The method according to claim 28, further comprising subtracting material from the defective phase shift mask.

33. The method according to claim 28, wherein the contacting step is carried out without application of voltage bias between the scanning probe microscope tip and the defective phase shift mask.

* * * * *